(12) United States Patent
Alfieri

(10) Patent No.: US 8,930,861 B2
(45) Date of Patent: Jan. 6, 2015

(54) SYSTEM, METHOD, AND COMPUTER PROGRAM PRODUCT FOR CONSTRUCTING A DATA FLOW AND IDENTIFYING A CONSTRUCT

(71) Applicant: NVIDIA Corporation, Santa Clara, CA (US)

(72) Inventor: Robert Anthony Alfieri, Chapel Hill, NC (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 13/868,954

(22) Filed: Apr. 23, 2013

(65) Prior Publication Data
US 2014/0282309 A1 Sep. 18, 2014

Related U.S. Application Data

(63) Continuation of application No. 13/844,330, filed on Mar. 15, 2013.

(51) Int. Cl.
G06F 17/50 (2006.01)
(52) U.S. Cl.
CPC .................. G06F 17/5045 (2013.01)
USPC ............ 716/102; 716/103; 716/104; 716/106
(58) Field of Classification Search
USPC .......................... 716/102–104, 106
See application file for complete search history.

(56) References Cited

U.S. PATENT DOCUMENTS

| 5,991,771 | A | 11/1999 | Falls et al. | |
|---|---|---|---|---|
| 6,192,365 | B1 | 2/2001 | Draper et al. | |
| 6,360,191 | B1 | 3/2002 | Koza et al. | |
| 6,393,386 | B1 | 5/2002 | Zager et al. | |
| 6,421,808 | B1 * | 7/2002 | McGeer et al. | 716/100 |
| 6,611,952 | B1 | 8/2003 | Prakash et al. | |
| 6,625,797 | B1 | 9/2003 | Edwards et al. | |
| 6,691,301 | B2 * | 2/2004 | Bowen | 717/114 |
| 6,836,877 | B1 | 12/2004 | Dupenloup | |
| 6,990,438 | B1 | 1/2006 | Chowdhury et al. | |
| 7,024,660 | B2 * | 4/2006 | Andrade et al. | 717/124 |
| 7,058,562 | B2 | 6/2006 | Powell | |
| 7,143,387 | B2 | 11/2006 | Fields, Jr. et al. | |
| 7,159,183 | B1 * | 1/2007 | Kudukoli et al. | 715/762 |
| 7,240,335 | B2 | 7/2007 | Angel et al. | |
| 7,313,773 | B1 | 12/2007 | Braun et al. | |
| 7,343,594 | B1 | 3/2008 | Metzgen | |
| 7,363,610 | B2 * | 4/2008 | Alfieri | 716/103 |
| 7,383,529 | B2 * | 6/2008 | Gupta et al. | 716/104 |
| 7,395,358 | B2 | 7/2008 | Mills et al. | |

(Continued)

OTHER PUBLICATIONS

U.S. Appl. No. 13/844,374, filed Mar. 15, 2013.

(Continued)

*Primary Examiner* — Naum B Levin
(74) *Attorney, Agent, or Firm* — Zilka-Kotab, PC

(57) ABSTRACT

A system, method, and computer program product are provided for creating a hardware design. In use, one or more parameters are received, where at least one of the parameters corresponds to an interface protocol. Additionally, a data flow is constructed based on the one or more parameters. Further, an indication of one or more control constructs is received, where a hardware design is capable of being created, utilizing the constructed data flow and the one or more control constructs.

19 Claims, 4 Drawing Sheets

(56) References Cited

U.S. PATENT DOCUMENTS

| | | |
|---|---|---|
| 7,433,813 B1 | 10/2008 | Ballagh et al. |
| 7,472,055 B2 | 12/2008 | Garcia et al. |
| 7,483,823 B2 | 1/2009 | Alfieri |
| 7,577,707 B2 | 8/2009 | Hufferd et al. |
| 7,581,201 B2 | 8/2009 | Kazda et al. |
| 7,743,370 B1 | 6/2010 | Krablin et al. |
| 7,802,147 B1 | 9/2010 | Johnson et al. |
| 7,827,510 B1 | 11/2010 | Schubert et al. |
| 8,117,574 B2 | 2/2012 | Deutschle et al. |
| 8,141,059 B2 | 3/2012 | Ding et al. |
| 8,180,943 B1 | 5/2012 | Priem |
| 8,219,974 B2 | 7/2012 | Schmidt |
| 8,458,630 B1 | 6/2013 | Van Canpenhout |
| 8,463,589 B2 | 6/2013 | Clark et al. |
| 8,464,217 B2 | 6/2013 | Janczewski |
| 8,468,335 B2 * | 6/2013 | Lin et al. ............... 713/100 |
| 8,558,839 B1 | 10/2013 | Wyatt |
| 8,561,176 B1 | 10/2013 | Dalcher |
| 2002/0019969 A1 | 2/2002 | Hellestrand et al. |
| 2003/0121010 A1 | 6/2003 | Aubury |
| 2004/0226006 A1 | 11/2004 | Russell |
| 2005/0050509 A1 | 3/2005 | Fields, Jr. et al. |
| 2006/0041872 A1 | 2/2006 | Poznanovic et al. |
| 2007/0055966 A1 | 3/2007 | Waddington et al. |
| 2007/0219771 A1 | 9/2007 | Verheyen et al. |
| 2010/0088666 A1 * | 4/2010 | Box et al. ............... 717/104 |
| 2013/0014095 A1 | 1/2013 | Metzgen |
| 2013/0019216 A1 | 1/2013 | Vasudevan et al. |

OTHER PUBLICATIONS

U.S. Appl. No. 13/844,437, filed Mar. 15, 2013.
U.S. Appl. No. 13/844,400, filed Mar. 15, 2013.
U.S. Appl. No. 13/844,477, filed Mar. 15, 2013.
U.S. Appl. No. 13/860,463, filed Apr. 10, 2013.
U.S. Appl. No. 13/860,472, filed Apr. 10, 2013.
U.S. Appl. No. 13/860,480, filed Apr. 10, 2013.
Final Office Action from U.S. Appl. No. 13/844,437, dated Jul. 15, 2014.
Non-Final Office Action from U.S. Appl. No. 13/844,437, dated Jan. 27, 2014.
Non-Final Office Action from U.S. Appl. No. 13/860,463, dated Feb. 27, 2014.
Notice of Allowance from U.S. Appl. No. 13/860,472, dated May 21, 2014.
Non-Final Office Action from U.S. Appl. No. 13/860,480, dated May 13, 2014.

* cited by examiner

SYSTEM, METHOD, AND COMPUTER PROGRAM PRODUCT FOR CONSTRUCTING A DATA FLOW AND IDENTIFYING A CONSTRUCT

CLAIM OF PRIORITY

This application is a continuation of U.S. application Ser. No. 13/844,330, filed Mar. 15, 2013, which is incorporated herein by reference in its entirety.

FIELD OF THE INVENTION

The present invention relates to integrated circuit design.

BACKGROUND

Hardware design and verification are important aspects of the hardware creation process. For example, a hardware description language may be used to model and verify circuit designs. However, current techniques for designing hardware have been associated with various limitations.

For example, validation and verification may comprise a large portion of a hardware design schedule utilizing current hardware description languages. Additionally, flow control and other protocol logic may not be addressed by current hardware description languages during the hardware design process. There is thus a need for addressing these and/or other issues associated with the prior art.

SUMMARY

A system, method, and computer program product are provided for constructing a data flow (e.g., a representation of a flow of data through a hardware design, etc.). In use, one or more parameters are received, where at least one of the parameters corresponds to an interface protocol. Additionally, a data flow is constructed based on the one or more parameters. Further, an indication of one or more control constructs (e.g., constructions that may perform various common data steering and storage operations, etc.) is received, where a hardware design is capable of being created, utilizing the constructed data flow and the one or more control constructs.

DETAILED DESCRIPTION

In various embodiments, data flows and constructs that represent a hardware design including one or more circuits are specified. The data flows and constructs are analyzed by a hardware design application program that includes one or more components. The hardware design application program may analyze the data flows and constructs, identify errors, and/or generate a representation of the hardware design that is suitable for simulation and/or synthesis.

Figure 1:
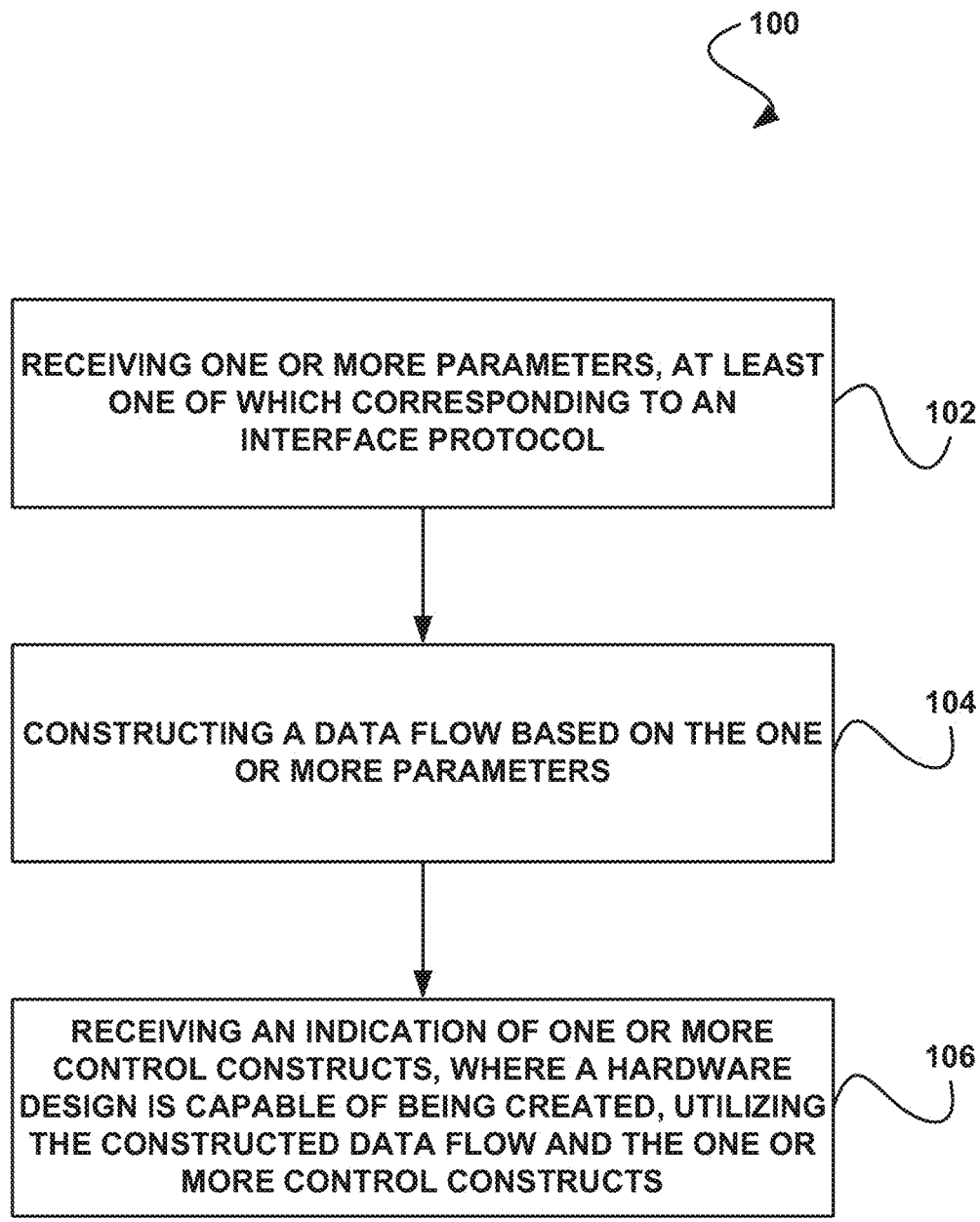
FIG. 1 shows a method for constructing a data flow, in accordance with one embodiment.

FIG. 1 shows a method 100 for constructing a data flow, in accordance with one embodiment. As shown in operation 102, one or more parameters are received, where at least one of the parameters corresponds to an interface protocol. In one embodiment, the interface protocol may include a communications protocol associated with a particular interface. In another embodiment, the communications protocol may include one or more formats for communicating data utilizing the interface, one or more rules for communicating data utilizing the interface, a syntax used when communicating data utilizing the interface, semantics used when communicating data utilizing the interface, synchronization methods used when communicating data utilizing the interface, etc.

Additionally, in one embodiment, the one or more parameters may include an identification of an interface (e.g., an interface of a hardware design, etc.). In another embodiment, the one or more parameters may include a width field associated with the interface. In yet another embodiment, the one or more parameters may be received utilizing a hardware description language. For example, one or more parameters may be received utilizing a hardware description language embedded in a scripting language.

Further, as shown in operation 104, a data flow is constructed based on the one or more parameters. In one embodiment, the data flow (input or output) may represent a flow of data. For example, the data flow may represent a flow of data through a hardware design. In another embodiment, the data flow may include one or more groups of signals. For example, the data flow may include one or more groups of signals including implicit flow control signals that may operate according to the interface protocol. In yet another embodiment, the data flow may be associated with one or more interfaces. For example, the data flow may be associated with one or more interfaces of a hardware design corresponding to at least one of the received parameters. In another embodiment, the data flow may be constructed as a data type.

Also, in one embodiment, constructing the data flow as a data type may include implementing the data flow as an instance of a formal object class within a hardware description language. In another embodiment, the constructed data flow may include one or more fields with assigned values (e.g., one or more width fields each associated with an interface, etc.). In yet another embodiment, the constructed data flow may be viewed as a predetermined data structure (e.g., a hash, etc.) within the scripting language.

Further, in one embodiment, the data flow may have multiple levels of hierarchy. For example, the data flow may include a superflow that represents multiple flows of data (e.g., subflows, etc.) and that is associated with a plurality of interfaces. In another embodiment, the superflow may act as an array within the scripting language. In yet another embodiment, the superflow may include one or more subfields with assigned values. In still another embodiment, the data flow may be included within the superflow (e.g., as a data flow within the hierarchy of the superflow, etc.).

Further still, in one embodiment, the data flow may have a numeric hierarchy. For example, all fields of a data flow may be numbered with successive whole integers, starting at zero. In another embodiment, the data flow may have an alphabetic hierarchy. For example, all fields of a data flow may be labeled with one or more identifiers (e.g., letters of the alphabet, symbols, numbers, etc.). In yet another embodiment, the data flow may have a custom naming hierarchy. For example, all fields of a data flow may be labeled with custom (e.g., user-provided, etc.) names.

Also, in one embodiment, the data flow may include a cloned data flow. For example, the data flow may be created by cloning another data flow, utilizing the hardware description language. In another embodiment, the data flow itself may be cloned to create another data flow. In yet another embodiment, the data flow may be an output data flow of a construct. In still another embodiment, the data flow may be located in a database.

In addition, as shown in operation 106, an indication of one or more control constructs is received, where a hardware design is capable of being created, utilizing the constructed data flow and the one or more control constructs. In one embodiment, there may be two categories of constructs (e.g., constructions), control constructs and compute constructs. Control constructs may perform various common data steering and storage operations, be implemented in the hardware design application program, and be inserted into a hardware design representation. Compute constructs may provide a mechanism by which a designer can represent circuitry to perform user-defined operations. For example, in one embodiment, the function of a particular state machine may be encoded within a compute construct.

In one embodiment, the one or more control constructs may include an entity (e.g., a module, etc.) implemented as part of the hardware description language that receives one or more data flows as input. In another embodiment, the one or more control constructs may be located in a database. In yet another embodiment, the one or more control constructs may perform one or more operations based on the input data flow or flows. In still another embodiment, the one or more control constructs may be built into the hardware description language. In another example, the one or more control constructs may perform one or more data steering and storage operations, utilizing the constructed data flow as input.

Furthermore, in one embodiment, the one or more control constructs may each create one or more output data flows, based on one or more input data flows. In another embodiment, the one or more output data flows may be input into one or more additional constructs (e.g., control constructs, compute constructs, etc.). In yet another embodiment, the one or more control constructs may each include one or more parameters. For example, the one or more control constructs may each include a name parameter that may indicate a name for that construct. In another example, each of the one or more control constructs may include a comment parameter that may provide a textual comment that may appear in a debugger when debugging a design. In yet another example, each of the one or more control constructs may include a stallable parameter that may indicate whether automatic flow control is to be performed within that construct.

Further still, in one example, each of the one or more control constructs may include a parameter used to specify a depth of an output queue (e.g., a first in, first out (FIFO) queue, etc.) for each output data flow of that construct. In another example, each of the one or more control constructs may include a parameter that causes an output data flow of that construct to be registered out. In yet another example, each of the one or more control constructs may include a parameter that causes a ready signal of an output data flow of that construct to be registered in and an associated skid flop row to be added.

Also, in one embodiment, one or more of the control constructs may include a separate construct that creates multiple output data flows from a single input data flow. In another embodiment, one or more of the control constructs may include a merge construct that creates a single output data flow from multiple input data flows. In yet another embodiment, one or more of the control constructs may include a multicast construct that takes a single input data flow and sends it to one or more output data flows. In still another embodiment, one or more of the control constructs may include a select construct that accepts multiple input data flows and selects one of them to be an output data flow.

Additionally, in one embodiment, one or more of the control constructs may include a connect construct that connects an input data flow of the construct to a deferred output. A deferred output may include a primary input to the design or an input data flow that does not yet connect to an output data flow of another construct. In another embodiment, one or more of the control constructs may include an as construct that maps flow data to a different format. In yet another embodiment, one or more of the control constructs may include a shuffle construct that rearranges a structuring of input data flows. In still another embodiment, one or more of the control constructs may include a derive clock construct that creates a new clock from an existing clock.

Further, in one embodiment, the hardware design may include one or more of the following: a circuit design, a behavioral simulation model, an estimated timing model, etc. For example, the hardware design may include an integrated circuit design, a digital circuit design, an analog circuit design, a mixed-signal circuit design, etc. In another embodiment, the hardware design may be created utilizing the hardware description language. For example, the hardware design may be created by initiating a new hardware design and saving the new hardware design into a database, utilizing the hardware description language. In yet another embodiment, both the data flow and the construct may be included within the hardware design.

Further still, in one embodiment, the hardware design may be created by activating the constructed data flow. For example, the data flow may be inactive while it is being constructed and modified, and the data flow may subsequently be made active (e.g., by passing the data flow to an activation function utilizing the hardware description language, etc.). In another embodiment, the hardware design may be created by inputting the activated data flow into the construct. For example, the activated data flow may be designated as an input of the construct within the hardware design, utilizing the hardware description language. In this way, the construct may perform one or more operations, utilizing the input data flow, and may create one or more additional output data flows, utilizing the input data flow.

Also, in one embodiment, the data flow may be analyzed within the construct. For example, the data flow may be analyzed during the performance of one or more actions by the construct, and execution of the hardware design may be halted immediately if an error is discovered during the analysis. In this way, errors within the hardware design may be determined immediately and may not be propagated during the execution of the hardware design, until the end of hardware construction, or during the running of a suspicious language flagging program (e.g., a lint program) on the hardware construction. In another embodiment, the construct may analyze the data flow input to the construct and determine whether the data flow is an output flow from another construct or a deferred output (e.g., a data flow that is a primary design input, a data flow that will be later connected to an output of a construct, etc.). In this way, it may be confirmed that the input data flow is an active output.

In addition, in one embodiment, one or more of the control constructs may interrogate the data flow utilizing one or more introspection methods. For example, one or more of the control constructs may utilize one or more introspection methods to obtain field names within the data flow, one or more widths associated with the data flow, etc. In another embodiment, all clocking may be handled implicitly within the hardware design. For example, a plurality of levels of clock gating may be generated automatically and may be supported by the hardware design language. In this way, manual clock gating may be avoided. In yet another embodiment, one or more of the control constructs may be superflow aware. For example, the data flow may include a superflow, and one or more of the control constructs may perform automatic looping on a plurality of subflows of the superflow, such that each subflow of the superflow is automatically analyzed within the one or more control constructs.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Figure 2:
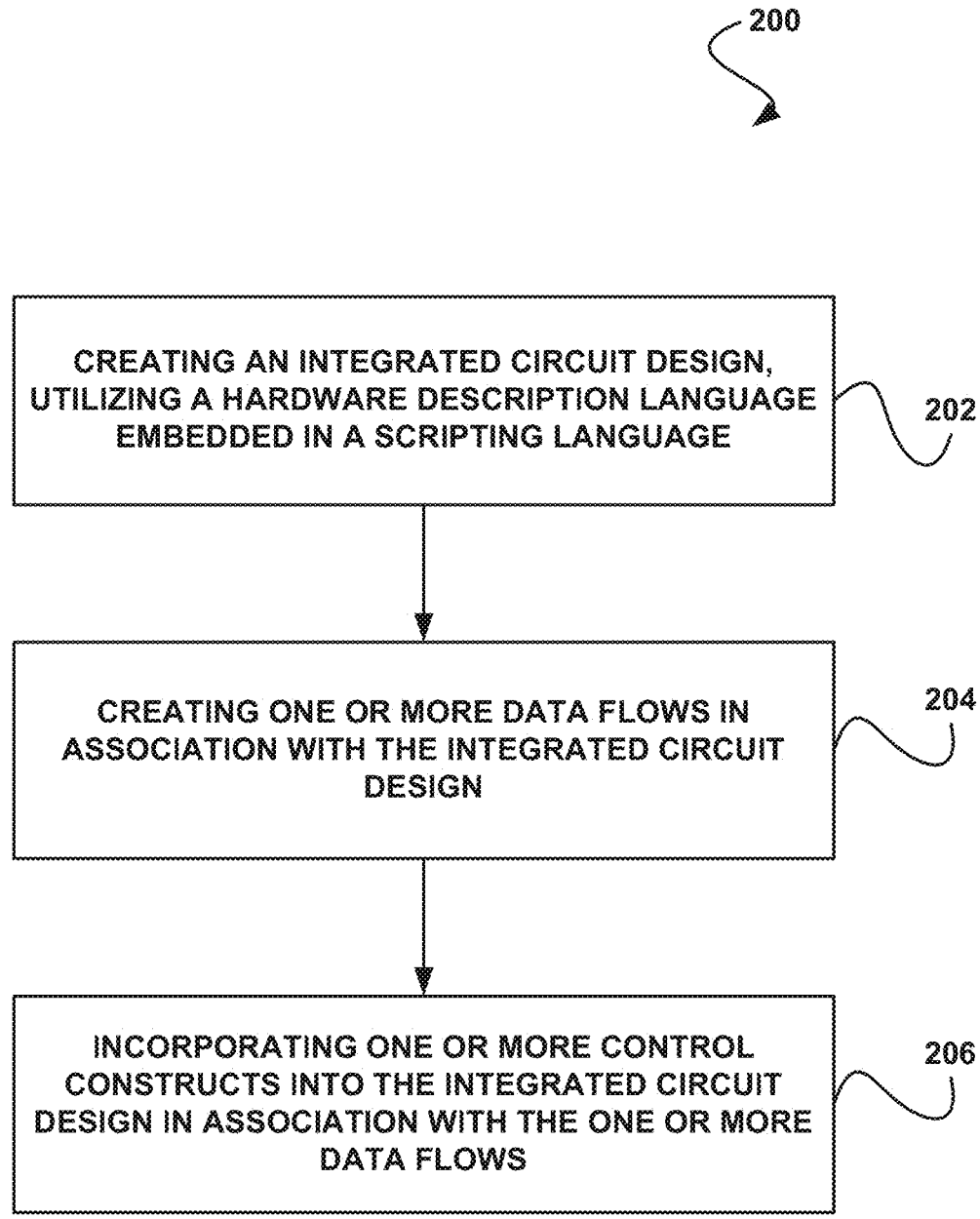
FIG. 2 shows a method for building an integrated circuit using data flows and constructs, in accordance with another embodiment.

FIG. 2 shows a method 200 for building an integrated circuit using data flows and constructs, in accordance with one embodiment. As an option, the method 200 may be carried out in the context of the functionality of FIG. 1. Of course, however, the method 200 may be implemented in any desired environment. It should also be noted that the aforementioned definitions may apply during the present description.

As shown in operation 202, an integrated circuit design is created, utilizing a hardware description language embedded in a scripting language. In one embodiment, the integrated circuit design may be saved to a database or hard drive after the integrated circuit design is created. In another embodiment, the integrated circuit design may be created in the hardware description language. In yet another embodiment, the integrated circuit may be created utilizing a design create construct. Table 1 illustrates an exemplary design create construct that may be used within the scripting language to create an integrated circuit design, in accordance with one embodiment. Of course, it should be noted that the exemplary design create construct shown in Table 1 is set forth for illustrative purposes only, and thus should not be construed as limiting in any manner.

TABLE 1 aFlow->Design_Create( name => "NV_XX_yyy" );
...
aFlow->Design_Save( top => $topio );

Additionally, in one embodiment, one or more options may be associated with the creation of the integrated circuit design. Table 2 illustrates exemplary circuit design options, in accordance with one embodiment. Of course, it should be noted that the exemplary circuit design options shown in Table 2 are set forth for illustrative purposes only, and thus should not be construed as limiting in any manner.

TABLE 2

| Option | Type | Default | Description |
|---|---|---|---|
| name | id | required | name of top-level module for design |
| clks | array_of_clkspec | [ {clk => "clk", reset_ => "reset_"} ] | array of into about primary clk-reset pairs; clkspec is a hash with "clk" and "reset_" as required fields and currently there are no optional clkspec fields, but there will likely be others in the future; the first clk name in the array becomes the default for created constructs |
| src_dirs | array_of_string | [ "." ] | array of directories Design_Inst( ) searches for source databases of instantiated designs; by default, we search only in the current directory; note that this has nothing to do with the directories Perl searches for .pm modules |

Further, as shown in operation 204, one or more data flows are created in association with the integrated circuit design. In one embodiment, each of the one or more data flows may represent a flow of data through the integrated circuit design and may be implemented as instances of a data type utilizing a scripting language (e.g., Perl, etc.). For example, each data flow may be implemented in Perl as a formal object class. In another embodiment, one or more data flows may be associated with a single interface. In yet another embodiment, one or more data flows may be associated with multiple interfaces, and each of these data flows may be called superflows. For example, superflows may allow the passing of multiple interfaces utilizing one variable.

Further still, in one embodiment, each of the one or more data flows may have an arbitrary hierarchy. In another embodiment, each node in the hierarchy may have alphanumeric names or numeric names. In yet another embodiment, the creation of the one or more data flows may be tied into array and hash structures of the scripting language. For example, Verilog® literals may be used and may be automatically converted into constant data flows by a preparser before the scripting language sees them.

Also, in one embodiment, once created, each of the one or more data flows may look like hashes to scripting code. In this way, the data flows may fit well into the scripting language's way of performing operations, and may avoid impedance mismatches. In another embodiment, the one or more data flows may be created in the hardware description language. Table 3 illustrates an exemplary data flow creation within a scripting language, in accordance with one embodiment. Of course, it should be noted that the exemplary data flow creation shown in Table 3 is set forth for illustrative purposes only, and thus should not be construed as limiting in any manner.

TABLE 3 my $In = aFlow
    ->Hier( a => 22, b => 32, c => 42 )
    ->Defer_Output( );

As shown in Table 3, a data flow may be represented by an aFlow class package within the scripting language. In one embodiment, the data flow may represent a single interface with multiple named signals within the design. In another embodiment, flow control may be handled implicitly. In another embodiment, data may be defined for a single cycle within the design.

Additionally, in one embodiment, a data flow may have multiple levels of hierarchy. For example, the root of the hierarchy may be called level 0, or level "top." In another example, the leaves may be unsigned integers of an assigned bit width. In another embodiment, a hierarchical level may have all alphanumeric names or all numeric names. For example, if the names are numeric, they may be numbered with whole integers starting with zero.

Further, in one embodiment, a level in the hierarchy may be called the iflow level. For example, iflow may refer to an interface data flow. In another example, the iflow level may denote one interface, specifically the data for one cycle on the interface. In another embodiment, by default, a root of the data flow hierarchy may be the iflow level. In this way, each data flow may represent one interface by default. In yet another embodiment, flow control may be handled implicitly for each iflow.

Further still, in one embodiment, one or more of the data flows may include a superflow. For example, a superflow may include a data flow whose iflow level is lower than the top level. In this way, a superflow may have multiple iflows (each representing an interface with independent flow control) within it. In another embodiment, each of the one or more data flows may have an inactive or active status. For example, while a data flow is being constructed, it may be inactive. In another example, inactive data flows may be modified in any arbitrary way. In yet another embodiment, nodes may be added and removed in the hierarchy.

Also, in one embodiment, before a data flow can be passed to a construct, it may need to be made active (e.g., using a command such as Defer_Output( ), etc.). At that point, the data flow may not be modified directly by a user, but only indirectly by control and compute constructs. In another embodiment, Defer_Output( ) may have an option that lets you pick which level in the data flow that is the iflow level. In yet another embodiment, by default, level 0 (top) may be the iflow level.

Table 4 illustrates exemplary data flow creation constructs within a scripting language, in accordance with one embodiment. Of course, it should be noted that the exemplary data flow creation constructs shown in Table 4 are set forth for illustrative purposes only, and thus should not be construed as limiting in any manner.

TABLE 4

1. Hier( ) may create a named hierarchy of arbitrary structure
2. Hier_N( ) may create numeric hierarchies
3. Hier_Named_N( ) may create a named hierarchy with N fields with the same name prefix
4. Hash manipulations may allow you to add and remove subflows from hierarchies
5. Uint( ) may create a simple leaf flow with no name
6. Const( $val ) may create a leaf that has a constant value
7. Const_All_Ones( $width ) may create a leaf that has a constant value that is width $width and all 1's
8. Literals like 32'hdeadbeef may implicitly create constant values
9. Clone( ) may copy an active or inactive flow, and may always yield an inactive flow; all constant leaves may also be cloned
10. Clone(0) is like Clone( ) but may not clone constant leaves Table 5 illustrates the creation of a one-level hierarchy data flow within a scripting language, in accordance with one embodiment. Of course, it should be noted that the exemplary data flow creation shown in Table 5 is set forth for illustrative purposes only, and thus should not be construed as limiting in any manner.

TABLE 5

```
my $Flow = aFlow
        ->Hier( a => 12, b => 33, c => 46 );
$Flow->print( "Flow" );
# add a field, remove a field
delete $Flow->{a};
$Flow->{d} = 55;
$Flow->print( "Flow after removing 'a' and adding 'd'" );
$Flow->Defer_Output( );
$Flow->print( "Flow after marking it active" );
Flow =>
    a => 12
    b => 33
    c => 46
Flow after removing 'a' and adding 'd' =>
    b => 33
    c => 46
    d => 55
Flow after marking it active => (iflow)
    b => 33
    c => 46
    d => 55
```

As shown in Table 5, a one-level hierarchy data flow is created with alphanumeric names "a," "b," and "c." Additionally, field "a" is then removed and field "d" is added. Further, the data flow is marked active using Defer_Output( ) with the iflow at the root.

Table 6 illustrates the creation of a two-level hierarchy data flow within a scripting language, in accordance with one embodiment. Of course, it should be noted that the exemplary data flow creation shown in Table 6 is set forth for illustrative purposes only, and thus should not be construed as limiting in any manner.

TABLE 6

```
my $Flow = aFlow
        ->Hier( a => 12, b => [c => 33, d => 46] );
$Flow->print( "Flow" );
$Flow->{e} = [f => 11, g => 32];
$Flow->print( "Flow after adding sub-hierarchy 'e'" );
Flow =>
    a => 12
    b =>
        c => 33
        d => 46
Flow after adding sub-hierarchy 'e' =>
    a => 12
    b =>
        c => 33
        d => 46
    e =>
        f => 11
        g => 32
```

Table 7 illustrates the creation of a data flow with manual numbering within a scripting language, in accordance with one embodiment. Of course, it should be noted that the exemplary data flow creation shown in Table 7 is set forth for illustrative purposes only, and thus should not be construed as limiting in any manner.

TABLE 7

```
# numeric hierarchy created manually using a loop
my $fields = [ ];
for my $i ( 0 .. 3 )
{
```

TABLE 7-continued

```
    apush $fields, $i => [a => 12, b => 3]; # equivalent to push
    @{$fields}, ...
}
my $Flow = aFlow
        ->Hier( @{$fields} )
        ->Defer_Output( );
$Flow->print( "Flow" );
Flow => (iflow)
    0 =>
        a => 12
        b => 3
    1 =>
        a => 12
        b => 3
    2 =>
        a => 12
        b => 3
    3 =>
        a => 12
        b => 3
```

Table 8 illustrates the creation of a data flow with automatic numbering within a scripting language, in accordance with one embodiment. Of course, it should be noted that the exemplary data flow creation shown in Table 8 is set forth for illustrative purposes only, and thus should not be construed as limiting in any manner.

TABLE 8

```
my $Flow = aFlow
        ->Hier_N( 4, [a => 12, b => 3] )
        ->Defer_Output( );
$Flow->print( "Flow" );
Flow => (iflow)
    0 =>
        a => 12
        b => 3
    1 =>
        a => 12
        b => 3
    2 =>
        a => 12
        b => 3
    3 =>
        a => 12
        b => 3
```

Table 9 illustrates the creation of a data flow with a named hierarchy with N names with the same prefix within a scripting language, in accordance with one embodiment. Of course, it should be noted that the exemplary data flow creation shown in Table 9 is set forth for illustrative purposes only, and thus should not be construed as limiting in any manner.

TABLE 9

```
my $Flow = aFlow
        ->Hier_Named_N( "prefix", 4, [a => 12, b => 3] )
        ->Defer_Output( );
$Flow->print( "Flow" );
Flow => (iflow)
    prefix0 =>
        a => 12
        b => 3
    prefix1 =>
        a => 12
        b => 3
    prefix2 =>
        a => 12
        b => 3
    prefix3 =>
        a => 12
        b => 3
```

Table 10 illustrates the creation and cloning of a data flow within a scripting language, in accordance with one embodiment. Of course, it should be noted that the exemplary data flow creation and cloning shown in Table 10 is set forth for illustrative purposes only, and thus should not be construed as limiting in any manner.

TABLE 10

```
my $Flow0 = aFlow
        ->Hier_N( 4, [a => 12, b => 3] )
        ->Defer_Output( iflow_level => 1 );
$Flow0->print( "Flow0" );
my $Flow1 = $Flow0->Clone( );
delete $Flow1->{1};  # causes 2 and 3 to be renumbered down
$Flow1->Defer_Output( );
$Flow1->print( "Flow1 after removing node '1'" );
Flow0 =>
    0 => (iflow)
        a => 12
        b => 3
    1 => (iflow)
        a => 12
        b => 3
    2 => (iflow)
        a => 12
        b => 3
    3 => (iflow)
        a => 12
        b => 3
Flow1 after removing node '1' => (iflow)
    0 =>
        a => 12
        b => 3
    1 =>
        a => 12
        b => 3
    2 =>
        a => 12
        b => 3
```

As shown in Table 10, a data flow is created with an iflow level of 1, which ends up creating four iflows. Additionally, the active data flow is then cloned using Clone( ), which creates an inactive data flow. Field 1 is then deleted, which causes fields 2 and 3 to be renumbered down. Further, the new data flow is activated and the iflow level is set at level 0.

Table 11 illustrates the marking of an inactive data flow as an active output within a scripting language, in accordance with one embodiment. Of course, it should be noted that the exemplary data flow marking shown in Table 11 is set forth for illustrative purposes only, and thus should not be construed as limiting in any manner.

TABLE 11

```
my $In = aflow
        ->Hier( a => 22, b => 32, c => 42 )
        ->Defer_Output( );
    ...
Connect $Out => $In; # or $Out->Connect( $In )
```

As shown in Table 11, Defer_Output( ) is used to mark an inactive data flow as an active output, which may allow it to be used as an input to another construct, but deferring where it came from until later. In one embodiment, once a data flow is marked as active, it may not be changed directly, only by passing it to other constructs.

Additionally, in one embodiment, if a data flow is a primary input to the design, it may be passed to Design_Save( ) as part of the top I/O hash. In another embodiment, if the data flow is part of some kind of circular pipeline where the data flow goes into the top of the pipeline, then comes out the bottom later, a Connect operator may be used to connect the real output that comes out the bottom with the deferred output that went into the top.

Additionally, as shown in operation 206, one or more control constructs are incorporated into the integrated circuit design in association with the one or more data flows. In one embodiment, the one or more data flows may be passed into the one or more constructs, where they may be checked at each stage. In another embodiment, bugs may be immediately found and the design script may be killed immediately upon finding an error. In this way, a user may avoid reviewing a large amount of propagated errors. In yet another embodiment, the one or more control constructs may check that each input data flow is an output data flow from some other construct or is what is called a deferred output.

For example, a deferred output may include an indication that a data flow is a primary design input or a data flow will be connected later to the output of some future construct. In another embodiment, it may be confirmed that each input data flow is an input to no other constructs. In yet another embodiment, each construct may create one or more output data flows that may then become the inputs to other constructs. In this way, the concept of correctness-by-construction is promoted. In still another embodiment, the constructs are also superflow-aware. For example, some constructs may expect superflows, and others may perform an implicit 'for' loop on the superflow's subflows so that the user doesn't have to.

Furthermore, in one embodiment, a set of introspection methods may be provided that may allow user designs and generators to interrogate data flows. For example, the one or more control constructs may use these introspection functions to perform their work. More specifically, the introspection methods may enable obtaining a list of field names within a hierarchical data flow, widths of various subflows, etc. In another embodiment, in response to the introspection methods, values may be returned in forms that are easy to manipulate by the scripting language.

Further still, in one embodiment, the one or more control constructs may include constructs that are built into the hardware description language and that perform various data steering and storage operations that have to be built into the language. In another embodiment, the constructs may be bug-free as an incentive for the user to utilize them as much as possible.

Also, in one embodiment, the one or more control constructs may each contain a plurality of common parameters. For example, the one or more control constructs may contain a "name" parameter that indicates a base module name that will be used for the construct and which shows up in the debugger. In another embodiment, the one or more control constructs may contain a "comment" parameter that provides a textual comment that shows up in the debugger. In yet another embodiment, the one or more control constructs may contain a "stallable" parameter that indicates whether automatic flow control is to be performed according to an interface protocol within the construct (e.g., whether input data flows are to be automatically stalled when outputs aren't ready, etc.). For example, if the "stallable" parameter is 0, the user may use various flow methods such as Valid( ) and Ready( ), as well as a Stall statement to perform manual flow control. In another example, additional flow controls such as vld/rdy_next and vld/credit may be used.

Additionally, in one embodiment, the one or more control constructs may contain an out_fifo parameter that allows the user to specify a depth of the output FIFO for each output data flow. For example, when multiple output data flows are present, the user may supply one depth that is used by all, or an array of per-output-flow depths. In another embodiment, the one or more control constructs may contain an out_reg parameter that causes the output data flow to be registered out. For example, the out_reg parameter may take a 0 or 1 value or an array of such like out_fifo. In yet another embodiment, the one or more control constructs may contain an in_reg parameter that causes the input data flow to be registered in. In still another embodiment, the one or more control constructs may contain an in_fifo parameter that allows the user to specify a depth of the input FIFO for each output data flow. Further, in one embodiment, the one or more control constructs may contain an out_rdy_reg parameter that causes the output data flow's implicit ready signal to be registered in. This may also lay down an implicit skid flop before the out_reg. In another embodiment, out_fifo, out_reg, and out_rdy_reg may be mutually exclusive and may be used in any combination.

The "stallable", out_reg, out_fifo, and out_rdy_reg parameters specify how the interface protocol is implemented. An interface protocol defines a characteristic of an input or output data flow that is represented in a simulation model and a synthesized circuit created from the hardware design representation. For example, circuitry is automatically inserted into a representation of the hardware design based on the interface protocol. The automatic insertion reduces the amount of work needed to enter a design by a user and presumably also ensures that the interface protocol operation has been thoroughly verified. Furthermore, the hardware design application components may perform various checks to identify errors when data flows having incompatible interface protocols are connected. Errors may also be identified during simulation by the automatically inserted representations.

Further still, in one embodiment, clocking and clock gating may be handled implicitly. For example, there may be three levels of clock gating that may be generated automatically: fine-grain clock gating (FGCG), second-level module clock gating (SLCG), and block-level design clock gating (BLCG). In another embodiment, FGCG may be handled by synthesis tools. In yet another embodiment, a per-construct (i.e., per-module) status may be maintained. In still another embodiment, when the status is IDLE or STALLED, all the flops and rams in that module may be gated. In another embodiment, the statuses from all the constructs may be combined to form the design-level status that is used for the BLCG. This may be performed automatically, though the user may override the status value for any Compute( ) construct using the Status <value>statement.

Also, in one embodiment, the one or more control constructs may include a Separate( ) construct. For example, the Separate( ) construct may take an input data flow and provide ways of peeling off various fields from that data flow (e.g., by splitting a data flow into multiple output data flows and returning the output data flows, etc.). In another example, a user can create as many data flows as needed from a single input data flow. In another embodiment, regular expressions may be used to concisely describe the set of fields to be retained for each output data flow. If the input data flow is a superflow (multiple interface data flows), the Separate( ) construct may implicitly perform the same operation on the interface data flows in parallel. The output of the Separate( ) construct may be a list of data flows or a superflow containing them. In yet another embodiment, there may be options that allow levels of hierarchy to be automatically collapsed in the process. If the chosen fields have numeric names, they may be renumbered automatically (e.g., so they follow 0, 1, 2, etc.).

Further, in one embodiment, the Separate( ) construct may split the input data flow in one or more ways. For example, the Separate( ) construct may supply a list of fields to be kept for each output data flow. The list may contain regular expressions. In another example, the Separate( ) construct may supply a count of the number of fields to be kept for each output data flow. In yet another example, the Separate( ) construct may duplicate the input data flow N times, producing N+1 output data flows.

Table 12 illustrates the application of a Separate( ) construct to a data flow within a scripting language, in accordance with one embodiment. Of course, it should be noted that the exemplary application shown in Table 12 is set forth for illustrative purposes only, and thus should not be construed as limiting in any manner.

TABLE 12

```
my @Outs = $In->Separate( name => "NV_XX_yyy_split",
    keep => ["a,b",
             "b,c"] );
```

Table 13 illustrates the options associated with a Separate( ) construct, in accordance with one embodiment. Of course, it should be noted that the options shown in Table 13 are set forth for illustrative purposes only, and thus should not be construed as limiting in any manner.

TABLE 13

| Option | Type | Default | Description |
| --- | --- | --- | --- |
| name | id | required | name of generated module |
| comment | string | undef | optional comment to display in the debugger (highly recommended) |
| keep | array_of_namelist | one of these 3 is required | array of strings each of which is a list of names to keep for that output flow |
| keep_count | array_of_int | one of these 3 is required | array of counts each of which is the number of subflows to keep for that output flow |
| duplicate | int | one of these 3 is required | number of times to simply duplicate the input flow (this count + 1 are returned) |
| level | string | iflow | level at which to perform separate |
| remove_hier | array_of_int | [0, 0, . . . ] | array of boolean flags each of which indicates whether a level of hierarchy is to be removed for that output flow |
| clk | id | global default | clock to use for this construct |
| stallable | int | global default | whether the construct is stallable |
| out_reg | array_of_int | [global default, . . . ] | array of 0 or 1 indicating whether the corresponding output iflow is registered out |
| out_separate | int | 1 | indicates that the output is a separate list of flows (default value of 1) or a superflow (0) |
| out_rdy_reg | array_of_int | [global default, . . . ] | array of 0 or 1 indicating whether the corresponding output iflow's rdy signal is registered in; causes a skid flop to be added even if out_reg = 0. |
| out_fifo | array_of_fifospec | [0, 0, . . . ] | array of fifo specs, which are currently limited to a simple int representing depth of the fifo for the corresponding output iflow; out_reg and out_rdy_reg flops are after the fifo |

Further still, in one embodiment, if the stallable option is 1, then the input may be stalled until data can be advanced on all outputs (even if internally when out_reg=1out_reg). In another embodiment, the input may not be transferred to any output until all outputs can accept it. In yet another embodiment, if the stallable option is 0, a simulation-time check may be generated such that the input may always be transferred to all outputs whenever valid input is available.

Table 14 illustrates the application of a keep option within a Separate( ) construct, in accordance with one embodiment. Of course, it should be noted that the exemplary application shown in Table 14 is set forth for illustrative purposes only, and thus should not be construed as limiting in any manner.

TABLE 14

```
my $In = aFlow
        ->Hier( a => 12, b => 33, c => 46 )
        ->Defer_Output( );
$In->print( "In" );
In => (iflow)
    a => 12
    b => 33
    c => 46
my( $Out0, $Out1, $Out2, $Out3 ) = $In
        ->Separate( name => "NV_separate",
            keep => ["a,b",
                     "b,c",
                     "/", # matches all fields
                     "/$/"], # matches no fields
                     "/(?!b\$)/" ] );   # matches any field that is not 'b'
$Out0->print( "Out0" );
$Out1->print( "Out1" );
$Out2->print( "Out2" );
$Out3->print( "Out3" );
$Out4->print( "Out4" );
```

TABLE 14-continued

```
Out0 => (iflow)
    a => 12
    b => 33
Out1 => (iflow)
    b => 33
    c => 46
Out2 => (iflow)
    a => 12
    b => 33
    c => 46
```

TABLE 14-continued

```
Out3 => (iflow)
Out4 => (iflow)
    a => 12
    c => 46
```

As shown in Table 14, the keep option may allows for explicit naming of the subflows that are kept for each output data flow. In one embodiment, each name list may be enclosed in double quotes. In another embodiment, each name may be an identifier or a regular expression. In still another embodiment, unused input subflows may be dropped.

Table 15 illustrates the application of a duplicate option within a Separate( ) construct, in accordance with one embodiment. Of course, it should be noted that the exemplary application shown in Table 15 is set forth for illustrative purposes only, and thus should not be construed as limiting in any manner.

TABLE 15

```
my $In = aFlow
        ->Hier( d => 32, e => 8 )
        ->Defer_Output( );
$In->print( "In" );
In => (iflow)
    d => 32
    e => 8
my( $Out0, $Out1 ) = $In
        ->Separate( name      => "NV_separate_dup",
            duplicate => 1 );      # will get 2 copies
$Out0->print( "Out0" );
$Out1->print( "Out1" );
Out0 => (iflow)
    d => 32
    e => 8
Out1 => (iflow)
    d => 32
    e => 8
```

As shown in Table 15, the duplicate option may provide a quick way to completely duplicate the input data flow. In another embodiment, the count may be one less than the number of copies returned.

Table 16 illustrates the application of a keep_count option within a Separate( ) construct, in accordance with one embodiment. Of course, it should be noted that the exemplary application shown in Table 16 is set forth for illustrative purposes only, and thus should not be construed as limiting in any manner.

TABLE 16

```
my $In = aFlow
    ->Hier( 0 => [ m => 40 ],     # normally these are all the same,
but this makes it clearer what's happening
        1 => [ n => 2, o => 1 ],
        2 => [ p => 5, q => 10 ],
        3 => [ r => 3 ],
        4 => [ s => 17, t => 19 ] )
    ->Defer_Output( );
$In->print( "In" );
In => (iflow)
    0 =>
        m => 40
    1 =>
        n => 2
        o => 1
    2 =>
        p => 5
        q => 10
    3 =>
        r => 3
    4 =>
        s => 17
        t => 19
```

TABLE 16-continued

```
my( $Out0, $Out1 ) = $In
    ->Separate( name       => "NV_separate_keep_count",
        keep_count => [1, 3] );
$Out0->print( "Out0" );
$Out1->print( "Out1" );
Out0 => (iflow)
    0 =>
        m => 40
Out1 => (iflow)
    0 =>
        n => 2
        o => 1
    1 =>
        p => 5
        q => 10
    2 =>
        r => 3
```

As shown in Table 16, the keep_count option may split a numerical hierarchical into multiples where each output data flow contains some count of the next input subflows. In one embodiment, the chosen subflows may be renumbered in the second, third, etc. output data flows. In another embodiment, not all input subflows may need to be consumed (e.g., note that input subflow "4" was dropped).

Table 17 illustrates the application of remove_hier and out_reg options within a Separate( ) construct, in accordance with one embodiment. Of course, it should be noted that the exemplary application shown in Table 17 is set forth for illustrative purposes only, and thus should not be construed as limiting in any manner.

TABLE 17

```
my( $Out0, $Out1 ) = $In
    ->Separate( name        => "NV_separate_remove_hier",
        keep_count => [1, 3],
        remove_hier => [1, 0],     # remove hierarchy for
                                    first output flow
        out_reg => [0, 1] );    # flop second output flow
$Out0->print( "Out0" );
$Out1->print( "Out1" );
Out0 => (iflow)
    m => 40
Out1 => (iflow)
    0 =>
        n => 2
        o => 1
    1 =>
        p => 5
        q => 10
    2 =>
        r => 3
```

As shown in Table 17, the remove_hier option may allow for the removal of a level of a hierarchy for each output data flow. Additionally, the out_reg option may indicate that a particular output is to be flopped. For example, in Table 17, $Out1 will be flopped (and will have a skid register because stallable is 1 by default), while $Out0 will not be flopped.

Table 18 illustrates the parallel application of a Separate( ) construct, in accordance with one embodiment. Of course, it should be noted that the exemplary application shown in Table 18 is set forth for illustrative purposes only, and thus should not be construed as limiting in any manner.

TABLE 18

```
my $In = aFlow
    ->Hier_N( 4, [ a => 12, b => 22, c => 32 ] )
    ->Defer_Output( iflow_level => 1 );
$In->print( "In" );
In =>
    0 => (iflow)
        a => 12
        b => 22
        c => 32
```

TABLE 18-continued

```
    1 => (iflow)
       a => 12
       b => 22
       c => 32
    2 => (iflow)
       a => 12
       b => 22
       c => 32
    3 => (iflow)
       a => 12
       b => 22
       c => 32
my( $Out0, $Out1 ) = $In
    ->Separate( name      => "NV_separate_parallel_keep",
            keep      => ["a,b", "c"] );
$Out0->print( "Out0" );
$Out1->print( "Out1" );
Out0 =>
    0 => (iflow)
       a => 12
       b => 22
    1 => (iflow)
       a => 12
       b => 22
    2 => (iflow)
       a => 12
       b => 22
    3 => (iflow)
       a => 12
       b => 22
Out1 =>
    0 => (iflow)
       c => 32
    1 => (iflow)
       c => 32
    2 => (iflow)
       c => 32
    3 => (iflow)
       c => 32
```

As shown in Table 18, a Separate( ) occurs at the iflow level. If the input data flow has multiple iflows, then the Separate( ) may be repeated for each iflow. As also shown in Table 18, the input data flow has 4 iflows, each of which has subflows "a", "b", and "c."

Table 19 illustrates a separation of iflows using a level option, in accordance with one embodiment. Of course, it should be noted that the exemplary application shown in Table 19 is set forth for illustrative purposes only, and thus should not be construed as limiting in any manner.

TABLE 19

```
my( $Out0, $Out1 ) = $In
    ->Separate( name      => "NV_separate_above_iflow",
            level     => "top",
            keep_count => [1,3] );
$Out0->print( "Out0" );
$Out1->print( "Out1" );
```

TABLE 19-continued

```
Out0 =>
    0 => (iflow)
       a => 12
       b => 22
       c => 32
Out1 =>
    0 => (iflow)
       a => 12
       b => 22
       c => 32
    1 => (iflow)
       a => 12
       b => 22
       c => 32
    2 => (iflow)
       a => 12
       b => 22
       c => 32
```

As shown in Table 19, iflows are separated from each other from within the input data flow from Table 18, using the level option. The first iflow is placed in one output data flow, and the other three iflows are placed in another output data flow.

Additionally, in one embodiment, the one or more control constructs may include a Merge( ) construct. For example, the Merge( ) construct may be the inverse of the Separate( ) construct. In another embodiment, the Merge( ) construct may take multiple input data flows (e.g., in list form, superflow form, etc.) and may merge the corresponding fields into the same data flow. In yet another embodiment, when fields are names, they may not conflict in name. In still another embodiment, when fields are numbered, they may conflict so they may be renumbered. In another embodiment, all other features of the Separate( ) construct may be supported.

Table 20 illustrates the application of a Merge( ) construct to a data flow within a scripting language, in accordance with one embodiment. Of course, it should be noted that the exemplary application shown in Table 20 is set forth for illustrative purposes only, and thus should not be construed as limiting in any manner.

TABLE 20

```
my $Out = $In0
    ->Merge( name => "NV_XX_yyy_combine",
         Others => [$In1, $In2] );
```

Table 21 illustrates the options associated with a Merge( ) construct, in accordance with one embodiment. Of course, it should be noted that the options shown in Table 21 are set forth for illustrative purposes only, and thus should not be construed as limiting in any manner.

TABLE 21

| Option | Type | Default | Description |
| --- | --- | --- | --- |
| name | id | required | name of generated module |
| comment | string | undef | optional comment to display in the debugger (highly recommended) |
| Others | array_of_flow | required | array of other flows to be merged |
| level | string | iflow | level at which to perform the merge |
| add_hier | 0 or 1 | 0 | indicates whether to add a level of hierarchy to each input (at level) before doing the merge |
| clk | id | global default | clock to use for this construct |
| stallable | 0 or 1 | global default | whether the construct is stallable |
| out_reg | 0 or 1 | global default | 0 or 1 indicating whether the output iflow is registered out |

TABLE 21-continued

| Option | Type | Default | Description |
|---|---|---|---|
| out_rdy_reg | 0 or 1 | global default | 0 or 1 indicating whether the output iflow's rdy signal is registered in; causes a skid flop to be added even if out_reg = 0. |
| out_fifo | fifospec | 0 | a fifospec which is currently limited to a simple int representing depth of the fifo for the output iflow; out_reg and out_rdy_reg flops are after the fifo |

In one embodiment, the Merge( ) construct may take multiple input data flows and merge them into one output data flow. In another embodiment, if the stallable option is 1, then inputs may be stalled until all arrive and an output cycle can be advanced (even if internally when out_reg >0). In another embodiment, if the stallable option is 0, then all input data flows may be valid in the same cycle because there may be no way to stall any inputs. This may be checked at simulation time. Further, the output may not be stalled when the Merge( ) construct is trying to send out a new cycle.

Table 22 illustrates the merging of two data flows with non-conflicting names using a Merge( ) construct, in accordance with one embodiment. Of course, it should be noted that the exemplary merging shown in Table 22 is set forth for illustrative purposes only, and thus should not be construed as limiting in any manner.

TABLE 22

```
my $In0 = aFlow
    ->Hier( a => 25, b => 35 )
    ->Defer_Output( );
my $In1 = aFlow
    ->Hier( c => 33, d => 43 )
    ->Defer_Output( );
$In0->print( "In0" );
$In1->print( "In1" );
In0 => (iflow)
    a => 25
    b => 35
In1 => (iflow)
    c => 33
    d => 43
my $Out = $In0
    ->Merge( name => "NV_merge_named",
        Others => [$In1] );
$Out->print( "Out" );
Out => (iflow)
    a => 25
    b => 35
    c => 33
    d => 43
```

Table 23 illustrates the merging of two data flows with conflicting numeric names using a Merge( ) construct, in accordance with one embodiment. As shown in Table 23, the second data flow's 0 subflow is renumbered up to 1. Of course, it should be noted that the exemplary merging shown in Table 23 is set forth for illustrative purposes only, and thus should not be construed as limiting in any manner.

TABLE 23

```
my $In0 = aFlow
    ->Hier( 0 => [a => 25, b => 35] )
    ->Defer_Output( );
my $In1 = aFlow
    ->Hier( 0 => [a => 25, b => 35] )
    ->Defer_Output( );
```

TABLE 23-continued

```
$In0->print( "In0" );
$In1->print( "In1" );
In0 => (iflow)
    0 =>
        a => 25
        b => 35
In1 => (iflow)
    0 =>
        a => 25
        b => 35
my $Out = $In0
    ->Merge( name => "NV_merge_numeric",
        Others => [$In1] );
$Out->print( "Out" );
Out => (iflow)
    0 =>
        a => 25
        b => 35
    1 =>
        a => 25
        b => 35
```

Table 24 illustrates the parallel use of a Merge( ) construct, in accordance with one embodiment. As shown in Table 24, if the input data flows have multiple iflows, the merge may occur in parallel. Of course, it should be noted that the exemplary usage shown in Table 24 is set forth for illustrative purposes only, and thus should not be construed as limiting in any manner.

TABLE 24

```
my $In0 = aFlow
    ->Hier_N( 3, [a => 25, b => 35] )
    ->Defer_Output( iflow_level => 1 );
my $In1 = aFlow
    ->Hier_N( 3, [c => 33, d => 43] )
    ->Defer_Output( iflow_level => 1 );
$In0->print( "In0" );
$In1->print( "In1" );
In0 =>
    0 => (iflow)
        a => 25
        b => 35
    1 => (iflow)
        a => 25
        b => 35
    2 => (iflow)
        a => 25
        b => 35
In1 =>
    0 => (iflow)
        c => 33
        d => 43
    1 => (iflow)
        c => 33
        d => 43
    2 => (iflow)
        c => 33
        d => 43
my $Out = $In0
    ->Merge( name  => "NV_merge_parallel",
        Others => [$In1] );
```

TABLE 24-continued

```
$Out->print( "Out" );
Out =>
    0 => (iflow)
        a => 25
        b => 35
        c => 33
        d => 43
    1 => (iflow)
        a => 25
        b => 35
        c => 33
        d => 43
    2 => (iflow)
        a => 25
        b => 35
        c => 33
        d => 43
```

Table 25 illustrates the use of a Merge( ) construct above the iflow level, in accordance with one embodiment. Of course, it should be noted that the exemplary usage shown in Table 25 is set forth for illustrative purposes only, and thus should not be construed as limiting in any manner.

TABLE 25

```
my $Out = $In0
    ->Merge( name   => "NV_merge_above_iflow",
             level  => 0,        # same as "top"
             Others => [$In1] );
$Out->print( "Out" );
Out =>
    0 => (iflow)
        a => 25
        b => 35
    1 => (iflow)
        a => 25
        b => 35
    2 => (iflow)
        a => 25
        b => 35
    3 => (iflow)
        c => 33
        d => 43
    4 => (iflow)
        c => 33
        d => 43
    5 => (iflow)
        c => 33
        d => 43
```

Table 26 illustrates the use of a Merge( ) construct above the top level, in accordance with one embodiment. For example, if the iflow level is 0 (e.g., top, etc.), a level of hierarchy may be added, which may require both level=>−1 and add_hier=>1. Of course, it should be noted that the exemplary usage shown in Table 26 is set forth for illustrative purposes only, and thus should not be construed as limiting in any manner.

TABLE 26

```
my $In0 = aFlow
    ->Hier( a => 25, b => 35 )
    ->Defer_Output( );
my $In1 = aFlow
    ->Hier( a => 25, b => 35 )
    ->Defer_Output( );
$In0->print( "In0" );
$In1->print( "In1" );
In0 => (iflow)
    a => 25
    b => 35
In1 => (iflow)
    a => 25
    b => 35
my $Out = $In0
    ->Merge( name     => "NV_merge_add_hier_above_top",
             Others   => [$In1],
             level    => −1,
             add_hier => 1 );
$Out->print( "Out" );
Out =>
    0 => (iflow)
        a => 25
        b => 35
    1 => (iflow)
        a => 25
        b => 35
```

Further, in one embodiment, the one or more control constructs may include a Multicast( ) construct. For example, the Multicast( ) construct may take a single data flow input and send it to one or more output data flows. In another embodiment, there may be various ways to specify the mask of outputs to receive the input, including embedding the mask in the input data flow or providing a separate Unicast/Destmask input data flow. In yet another embodiment, the Multicast( ) construct may implicitly work in parallel on input data flows that are superflows, and produce corresponding superflows. In still another embodiment, automatic data flow control may be provided if stallable is 1.

Table 27 illustrates the application of a Multicast( ) construct to a data flow within a scripting language, in accordance with one embodiment. Of course, it should be noted that the exemplary application shown in Table 27 is set forth for illustrative purposes only, and thus should not be construed as limiting in any manner.

TABLE 27

```
my $Out = $In
    ->Multicast( name             => "NV_XX_yyy_unicast",
                 count            => 3,
                 Unicast_Dest_Flow => $Dest_Flow );
```

Table 28 illustrates the options associated with a Multicast ( ) construct, in accordance with one embodiment. Of course, it should be noted that the options shown in Table 28 are set forth for illustrative purposes only, and thus should not be construed as limiting in any manner.

TABLE 28

| Option | Type | Default | Description |
| --- | --- | --- | --- |
| name | id | required | name of generated module |
| comment | string | undef | optional comment to display in the debugger (highly recommended) |
| count | int | required | number of output iflows per input iflow |
| broadcast | int | 1 of these 6 is required | broadcast to all <count> output iflows |

TABLE 28-continued

| Option | Type | Default | Description |
|---|---|---|---|
| Unicast_Dest_Flow | flow | 1 of these 6 is required | send to one output; the unicast flow must have one field of width log2(count) |
| unicast_dest_field | id | 1 of these 6 is required | send to one output; the destination is a separate field in the input with this name |
| Destmask_Flow | flow | 1 of these 6 is required | send to zero or more outputs; the destination mask must have one field of width <count> |
| destmask_field | id | 1 of these 6 is required | send to zero or more outputs; the destination mask is a separate field in the input with this name |
| destmask_code | code | 1 of these 6 is required | send to zero or more outputs; the destination mask is computed combinatorially by a user-supplied code block; the code block receives the input iflow and the output destmask flow as parameters from Multicast( ) |
| unicast_dest_field_drop | 0 or 1 | 0 | when unicast_dest_field is given, indicates whether to drop the field in the output iflows |
| destmask_field_drop | 0 or 1 | 0 | when destmask_field is given, indicates whether to drop the field in the output iflows |
| clk | id | global default | clock to use for this construct |
| stallable | 0 or 1 | global default | whether the construct is stallable |
| out_reg | array_of_int | [global default, . . . ] | array of 0 or 1 indicating whether the corresponding output iflow is registered out |
| out_rdy_reg | array_of_int | [global default, . . . ] | array of 0 or 1 indicating whether the corresponding output iflow's rdy signal is registered in; causes a skid flop to be added even if out_reg = 0. |
| out_fifo | array_of_fifospec | [0, 0, . . . ] | array of fifo specs, which are currently limited to a simple int representing depth of the fifo for the corresponding output iflow; out_reg and out_rdy_reg flops are after the fifo |
| out_separate | int | 0 | indicates whether to return a list of flows or return one superflow (default) |

In one embodiment, the Multicast( ) construct may take one input iflow and sends it to one or more output iflows. Table 29 illustrates various options for redirecting an input data flow using the Multicast ( ) construct, in accordance with one embodiment. Of course, it should be noted that the options shown in Table 29 are set forth for illustrative purposes only, and thus should not be construed as limiting in any manner.

TABLE 29

1. Use the broadcast => 1 option to send it always to all outputs
2. Use the Unicast_Dest_Flow option to have a side flow indicate the single output that should receive the input
3. Use the Destmask_Flow option to have a side flow that contains a bitmask indicating some arbitrary number of zero or more outputs to receive the input
4. Use the unicast_dest_field option to indicate that the unicast destination is embedded in the input as a separate field
5. Use the destmask_field option to indicate that the destmask is embedded in the input as a separate field
6. Use the destmask_code option that allows you to write arbitrary code to compute the destination using any combination of input fields Additionally, in one embodiment, the multicast may always occur at the iflow level. In another embodiment, if stallable is 1, then the input iflow may be stalled until all destined output iflows are unstalled. No outputs may receive the input until all of them are unstalled. In yet another embodiment, if stallable is 0, then the input iflow and the Unicast_Dest_Flow|Destmask_Flow iflow may be valid in the same cycle because there may be no way to stall any inputs. This may be checked at simulation time. Further, an output may not be stalled when the Multicast( ) construct is trying to send out a new cycle. In still another embodiment, the Multicast( ) construct ( ) may not return a list of data flows. Instead, it may returns a superflow containing all the output iflows. The out_separate=>1 option may be used to have the Multicast( ) construct return a list.

Table 30 illustrates the application of the broadcast option within a Multicast( ) construct, in accordance with one embodiment. Of course, it should be noted that the exemplary application shown in Table 30 is set forth for illustrative purposes only, and thus should not be construed as limiting in any manner.

TABLE 30

```
my $In = aFlow
    ->Hier( a => 12, b => 33, c => 46 )
    ->Defer_Output( );
```

TABLE 30-continued

```
    $In->print( "In" );
    In => (iflow)
        a => 12
        b => 33
        c => 46
    my $Out = $In
            ->Multicast( name      => "NV_multicast_broadcast",
                count       => 3,
                broadcast   => 1 );
    $Out->print( "Out" );
    Out =>
        0 => (iflow)
            a => 12
            b => 33
            c => 46
        1 => (iflow)
            a => 12
            b => 13
            c => 46
        2 => (iflow)
            a => 12
            b => 33
            c => 46
```

As shown in Table 30, there are three output iflows, and the output iflows are all under the same superflow.

Table 31 illustrates the application of the Unicast_Dest_Flow option within a Multicast( ) construct, in accordance with one embodiment. Of course, it should be noted that the exemplary application shown in Table 31 is set forth for illustrative purposes only, and thus should not be construed as limiting in any manner.

TABLE 31

```
    my $In = aFlow
            ->Hier( a => 12, b => 33, c => 46 )
            ->Defer_Output( );
    my $Dest = aFlow
            ->Hier( dest => 2 )
            ->Defer_Output( );
    $In->print( "In" );
    $Dest->print( "Dest" );
    In => (iflow)
        a => 12
        b => 33
        c => 46
    Dest => (iflow)
        dest => 2
    my $Out = $In
            ->Multicast( name      => "NV_multicast_unicast_dest_flow",
                count       => 3,
                Unicast_Dest_Flow => $Dest );
    $Out->print( "Out" );
    Out =>
        0 => (iflow)
            a => 12
            b => 33
            c => 46
        1 => (iflow)
            a => 12
            b => 33
            c => 46
        2 => (iflow)
            a => 12
            b => 33
            c => 46
```

As shown in Table 31, a single output iflow is sent and the destination is coming from a parallel iflow.

Table 32 illustrates the application of the unicast_dest_field option within a Multicast( ) construct, in accordance with one embodiment. Of course, it should be noted that the exemplary application shown in Table 32 is set forth for illustrative purposes only, and thus should not be construed as limiting in any manner.

TABLE 32

```
    my $In = aFlow
            ->Hier( a => 12, b => 33, c => 46, dest => 2 )
            ->Defer_Output( );
    $In->print( "In" );
    In => (iflow)
        a => 12
        b => 33
        c => 46
        dest => 2
    my $Out = $In
            ->Multicast( name      => "NV_multicast_unicast_dest_field",
                count       => 3,
                unicast_dest_field    => "dest",
                unicast_dest_field_drop => 1 );  # drop it from the output
    $Out->print( "Out" );
    Out =>
        0 => (iflow)
            a => 12
            b => 33
            c => 46
        1 => (iflow)
            a => 12
            b => 33
            c => 46
        2 => (iflow)
            a => 12
            b => 33
            c => 46
```

As shown in Table 32, the destination is encoded in the input packet itself using a "dest" field. The unicast_dest_field_drop option may be used to ensure that this does not end up in the output iflows.

Table 33 illustrates the application of the Destmask_flow option within a Multicast( ) construct, in accordance with one embodiment. Of course, it should be noted that the exemplary application shown in Table 33 is set forth for illustrative purposes only, and thus should not be construed as limiting in any manner.

TABLE 33

```
    my $In = aFlow
            ->Hier( a => 12, b => 33, c => 46 )
            ->Defer_Output( );
    my $Destmask = aFlow
            ->Hier( destmask => 3 )
            ->Defer_Output( );
    $In->print( "In" );
    $Destmask->print( "Destmask" );
    In => (iflow)
        a => 12
        b => 33
        c => 46
    Destmask => (iflow)
        destmask => 3
    my $Out = $In
            ->Multicast( name      => "NV_multicast_destmask_flow",
                count       => 3,
                Destmask_Flow => $Destmask );
    $Out->print( "Out" );
    Out =>
        0 => (iflow)
            a => 12
            b => 33
            c => 46
        1 => (iflow)
            a => 12
            b => 33
            c => 46
        2 => (iflow)
            a => 12
            b => 33
            c => 46
```

As shown in Table 33, a bitmask of any name that includes 0 to 3 iflows may be supplied to receive the input data flow.

Table 34 illustrates the application of the destmask_field option within a Multicast( ) construct, in accordance with one embodiment. Of course, it should be noted that the exemplary application shown in Table 34 is set forth for illustrative purposes only, and thus should not be construed as limiting in any manner.

TABLE 34

```
my $In = aFlow
    ->Hier( a => 12, b => 33, c => 46, destmask => 3 )
    ->Defer_Output( );
$In->print( "In" );
In => (iflow)
  a => 12
  b => 33
  c => 46
  destmask => 3
my $Out = $In
    ->Multicast( name           => "NV_multicast_destmask_field",
            count           => 3,
            destmask_field  => "destmask",
            destmask_field_drop => 1 ); # drop it from the output
$Out->print( "Out" );
Out =>
  0 => (iflow)
    a => 12
    b => 33
    c => 46
  1 => (iflow)
    a => 12
    b => 33
    c => 46
  2 => (iflow)
    a => 12
    b => 33
    c => 46
```

As shown in Table 34, the destmask may be embedded in the input data flow as the "destmask" field. The destmask_field_drop option may be used to drop the destmask from the output iflows.

Table 35 illustrates the application of the destmask_code option within a Multicast( ) construct, in accordance with one embodiment. Of course, it should be noted that the exemplary application shown in Table 35 is set forth for illustrative purposes only, and thus should not be construed as limiting in any manner.

TABLE 35

```
my $In = aFlow
    ->Hier( a => 12, b => 33, c => 46 )
    ->Defer_Output( );
$In->print( "In" );
In => (iflow)
  a => 12
  b => 33
  c => 46
my $Out = $In
    ->Multicast( name           => "NV_multicast_destmask_code",
            count           => 3,
            destmask_code   => sub
            {
              my( $In, $D ) = @_;
              # arbitrary destmask code using input fields
              #
              If $In->{a} == 0 Then
                $D->{destmask} <== 0;
              Else
                $D->{destmask} <== $In->{b} & 0x7;
              Endif
            }
          );
$Out->print( "Out" );
Out =>
```

TABLE 35-continued

```
  0 => (iflow)
    a => 12
    b => 33
    c => 46
  1 => (iflow)
    a => 12
    b => 33
    c => 46
  2 => (iflow)
    a => 12
    b => 33
    c => 46
```

As shown in Table 35, the destmask_code option may allow for the supplying of a code block to perform a computation of a destmask from various fields in the input, where such computations are performed combinationally. For example, destmask may be set to all 0's if "a" is 0; otherwise it may be set to the lower 3 bits of "b." In another embodiment, the code block may work similarly to Compute( ) code blocks. For example, the input iflow may be passed by Multicast( ) as the first argument. The second argument is the data flow holding "destmask" which may be assigned by the code block. If the input data flow has multiple iflows, the code block may get called for each input iflow, thus producing a separate destmask for each input iflow.

Table 36 illustrates the application of the Multicast( ) construct in parallel, in accordance with one embodiment. Of course, it should be noted that the exemplary application shown in Table 36 is set forth for illustrative purposes only, and thus should not be construed as limiting in any manner.

TABLE 36

```
my $In = aFlow
    ->Hier_N( 4, [a => 12, b => 33, c => 46] )
    ->Defer_Output( iflow_level => 1 );
my $Destmask = aFlow
    ->Hier_N( 4, [destmask => 3] )
    ->Defer_Output( iflow_level => 1 );
$In->print( "In" );
$Destmask->print( "Destmask" );
In =>
  0 => (iflow)
    a => 12
    b => 33
    c => 46
  1 => (iflow)
    a => 12
    b => 33
    c => 46
  2 => (iflow)
    a => 12
    b => 33
    c => 46
  3 => (iflow)
    a => 12
    b => 33
    c => 46
Destmask =>
  0 => (iflow)
    destmask => 3
  1 => (iflow)
    destmask => 3
  2 => (iflow)
    destmask => 3
  3 => (iflow)
    destmask => 3
my $Out = $In
    ->Multicast( name           => "NV_multicast_parallel_destmask_flow",
            count           => 3,
            Destmask_Flow => $Destmask );
$Out->print( "Out" );
Out =>
```

TABLE 36-continued

```
0 =>
    0 => (iflow)
        a => 12
        b => 33
        c => 46
    1 => (iflow)
        a => 12
        b => 33
        c => 46
    2 => (iflow)
        a => 12
        b => 33
        c => 46
1 =>
    0 => (iflow)
        a => 12
        b => 33
        c => 46
    1 => (iflow)
        a => 12
        b => 33
        c => 46
    2 => (iflow)
        a => 12
        b => 33
        c => 46
2 =>
    0 => (iflow)
        a => 12
        b => 33
        c => 46
    1 => (iflow)
        a => 12
        b => 33
        c => 46
    2 => (iflow)
        a => 12
        b => 33
        c => 46
3 =>
    0 => (iflow)
        a => 12
        b => 33
        c => 46
    1 => (iflow)
        a => 12
        b => 33
        c => 46
    2 => (iflow)
        a => 12
        b => 33
        c => 46
```

As shown in Table 36, the input data flow has 4 iflows, and each of those 4 iflows produces 3 output iflows in the final superflow. In one embodiment, a Shuffle( ) construct may be used to rearrange the output iflows.

Further still, in one embodiment, the one or more control constructs may include a Select( ) construct. For example, the Select( ) construct may be the inverse of Multicast( ) and may perform arbitration. In another embodiment, the Select( ) construct may take a list of data flows or a superflow where all interface data flows have the same structure, and may choose one interface data flow for its output. For example, one arbitration algorithm may be round-robin, but any type arbiter may be supported, including priority-based, LRU, weighted-RR, etc. In another embodiment, the arbiters may be implemented separately and may be registered, then referred to by name in the Select( ) construct. Further, in yet another embodiment, a user may supply their own arbitration code, or may supply the arbitration decision as a separate input data flow. Like Multicast( ), the input data flows may be superflows, and the Select( ) construct may be applied in parallel and may produce an output superflow containing the answers. Further, data flow control may be automatically managed by default.

Table 37 illustrates the application of a Select( ) construct to a data flow within a scripting language, in accordance with one embodiment. Of course, it should be noted that the exemplary application shown in Table 37 is set forth for illustrative purposes only, and thus should not be construed as limiting in any manner.

TABLE 37

```
my $Out = $In
    ->Select( name     => "NV_XX_yyy_arb",
              Arb_Flow => $Arb );
```

Table 38 illustrates the options associated with a Select( ) construct, in accordance with one embodiment. Of course, it should be noted that the options shown in Table 38 are set forth for illustrative purposes only, and thus should not be construed as limiting in any manner.

TABLE 38

| Option | Type | Default | Description |
| --- | --- | --- | --- |
| name | id | required | name of generated module |
| comment | string | undef | optional comment to display in the debugger (highly recommended) |
| arb | string | rr | arbitration algorithm if there is no Arb_Flow. rr is a simple round-robin algorithm without priorities and is the default. sp is a simple priority-based algorithm where iflow 0 has highest priority always, iflow 1 has next-highest priority always, etc. |
| Arb_Flow | flow | undef | separate arbitration flow; each arb iflow must have one field (any name) of width log2 (input_iflow_count) |
| keep_hier | 0 or 1 | 0 | indicates that the output iflow will have a dummy "0" node added above it |
| raise_iflow | 0 or 1 | 0 | when keep_hier => 1 is specified, indicates that the output iflow level will be above the dummy "0" node |
| out_src_name | string | undef | if specified, each output iflow will contain a field with this name that holds the index of the selected input iflow |
| clk | id | global default | clock to use for this construct |
| stallable | 0 or 1 | global default | whether the construct is stallable |

TABLE 38-continued

| Option | Type | Default | Description |
|---|---|---|---|
| out_reg | 0 or 1 | global default | 0 or 1 indicating whether the output iflow is registered out |
| out_rdy_reg | 0 or 1 | global default | 0 or 1 indicating whether the output iflow's rdy signal is registered in; causes a skid flop to be added even if out_reg = 0. |
| out_fifo | fifospec | 0 | a fifospec which is currently limited to a simple int representing depth of the fifo for the output iflow; out_reg and out_rdy_reg flops are after the fifo |

In one embodiment, the Select( ) construct may be the inverse of the Multicast( ) construct. The Select( ) construct may choose one iflow from multiple input iflows. For example, the Select( ) construct may act as an arbiter. In another embodiment, the Select( ) construct may perform a round-robin arbitration. In yet another embodiment, the Select( ) construct may allow for a user to supply an arbitration decision.

Additionally, in one embodiment, the Select( ) construct may occur at the level above the iflow level, (e.g., called the parent of the iflow level, etc.). In another embodiment, the parent may have numerically named children iflows 0, 1, etc. In yet another embodiment, if there are multiple parents, then an output iflow may be created for each parent's arbitration.

Further, in one embodiment, if the stallable option is 1, then inputs may be stalled if the output is stalled. Also, if an Arb_Flow is supplied, then the Arb_Flow and the chosen input data flow may both arrive before either can be retired. Unchosen input iflows may be stalled. In another embodiment, if the stallable option is 0, an Arb_Fow may still be used as an assertion check that the proper input flow is valid. That input may always be chosen. The output iflow may not be stalling when a chosen iflow is attempted to be transferred to it.

Further still, in one embodiment, the Select( ) construct may take in a superflow rather than a list of data flows. In another embodiment, an 'arb_code' option may exist that may allow a user to supply a code block with its own arbiter. There may also be an aFlow method to register an arbiter code block by name so that other designers may use them easily (e.g., arb=>"name", etc.). In this way, the system itself may not need to implement any arbiter.

Table 39 illustrates the application of round-robin arbitration within a Select( ) construct, in accordance with one embodiment. Of course, it should be noted that the exemplary application shown in Table 39 is set forth for illustrative purposes only, and thus should not be construed as limiting in any manner. As shown in Table 39, one output iflow is determined from three input iflows.

TABLE 39

```
my $In = aFlow
     ->Hier_N( 3, [a => 12, b => 33, c => 46] )
     ->Defer_Output( iflow_level => 1 );
$In->print( "In" );
In =>
  0 => (iflow)
     a => 12
     b => 33
     c => 46
  1 => (iflow)
     a => 12
     b => 33
     c => 46
```

TABLE 39-continued

```
  2 => (iflow)
     a => 12
     b => 33
     c => 46
my $Out = $In
     ->Select ( name => "NV_select_rr" );
$Out->print( "Out" );
Out => (iflow)
     a => 12
     b => 33
     c => 46
```

Table 40 illustrates the application of an Arb_Flow option within a Select( ) construct, in accordance with one embodiment. Of course, it should be noted that the exemplary application shown in Table 40 is set forth for illustrative purposes only, and thus should not be construed as limiting in any manner.

TABLE 40

```
my $In = aFlow
     ->Hier_N( 3, [a => 12, b => 33, c => 46] )
     ->Defer_Output( iflow_level => 1 );
my $Arb = aFlow
     ->Hier( arb => 2 )
     ->Defer_Output( );
$In->print( "In" );
$Arb->print( "Arb" );
In =>
  0 => (iflow)
     a => 12
     b => 33
     c => 46
  1 => (iflow)
     a => 12
     b => 33
     c => 46
  2 => (iflow)
     a => 12
     b => 33
     c => 46
Arb => (iflow)
  arb => 2
my $Out = $In
     ->Select ( name   => "NV_select_arb_flow",
                Arb_Flow => $Arb );
$Out->print( "Out" );
Out => (iflow)
     a => 12
     b => 33
     c => 46
```

As shown in Table 40, the arbitration decision comes from a separate $Arb data flow. In one embodiment, the $Arb data flow may have one field (any name) with width log 2(3)=2 in this case.

Table 41 illustrates the application of an keep_hier option within a Select( ) construct, in accordance with one embodiment. Of course, it should be noted that the exemplary application shown in Table 41 is set forth for illustrative purposes only, and thus should not be construed as limiting in any manner.

TABLE 41

```
my $In = aFlow
    ->Hier_N( 3, [a => 12, b => 33, c => 46] )
    ->Defer_Output( iflow_level => 1 );
my $Arb = aFlow
    ->Hier( arb => 2 )
    ->Defer_Output( );
$In->print( "In" );
$Arb->print( "Arb" );
In =>
  0 => (iflow)
    a => 12
    b => 33
    c => 46
  1 => (iflow)
    a => 12
    b => 33
    c => 46
  2 => (iflow)
    a => 12
    b => 33
    c => 46
Arb => (iflow)
    arb => 2
my $Out = $In
    ->Select ( name     => "NV_select_keep_hier",
               Arb_Flow => $Arb,
               keep_hier => 1 );
$Out->print( "Out" );
Out =>
  0 => (iflow)
    a => 12
    b => 33
    c => 46
```

As shown in Table 41, the numeric level of hierarchy may be removed from the output iflow. If a user wants to keep it, the keep_hier option may be used.

Table 42 illustrates the application of an raise_iflow option within a Select( ) construct, in accordance with one embodiment. Of course, it should be noted that the exemplary application shown in Table 42 is set forth for illustrative purposes only, and thus should not be construed as limiting in any manner.

TABLE 42

```
my $In = aFlow
    ->Hier_N( 3, [a => 12, b => 33, c => 46] )
    ->Defer_Output( iflow_level => 1 );
my $Arb = aFlow
    ->Hier( arb => 2 )
    ->Defer_Output( );
$In->print( "In" );
$Arb->print( "Arb" );
In =>
  0 => (iflow)
    a => 12
    b => 33
    c => 46
  1 => (iflow)
    a => 12
    b => 33
    c => 46
  2 => (iflow)
    a => 12
    b => 33
    c => 46
Arb => (iflow)
    arb => 2
my $Out = $In
    ->Select ( name     => "NV_select_raise_iflow",
               Arb_Flow => $Arb,
               keep_hier => 1,
               raise_iflow => 1 );
$Out->print( "Out" );
Out => (iflow)
```

TABLE 42-continued

```
  0 =>
    a => 12
    b => 33
    c => 46
```

As shown in Table 42, the iflow level may be made one level higher.

Table 43 illustrates the parallel application of a Select( ) construct, in accordance with one embodiment. Of course, it should be noted that the exemplary application shown in Table 43 is set forth for illustrative purposes only, and thus should not be construed as limiting in any manner.

TABLE 43

```
my $In = aFlow
    ->Hier_N( 4, aFlow->Hier_N( 3, [a => 12, b => 33, c => 46] ) )
    ->Defer_Output( iflow_level => 2 );
my $Arb = aFlow
    ->Hier_N( 4, [arb => 2] )
    ->Defer_Output( iflow_level => 1 );
$In->print( "In" );
$Arb->print( "Arb" );
In =>
  0 =>
    0 => (iflow)
      a => 12
      b => 33
      c => 46
    1 => (iflow)
      a => 12
      b => 33
      c => 46
    2 => (iflow)
      a => 12
      b => 33
      c => 46
  1 =>
    0 => (iflow)
      a => 12
      b => 33
      c => 46
    1 => (iflow)
      a => 12
      b => 33
      c => 46
    2 => (iflow)
      a => 12
      b => 33
      c => 46
  2 =>
    0 => (iflow)
      a => 12
      b => 33
      c => 46
    1 => (iflow)
      a => 12
      b => 33
      c => 46
    2 => (iflow)
      a => 12
      b => 33
      c => 46
  3 =>
    0 => (iflow)
      a => 12
      b => 33
      c => 46
    1 => (iflow)
      a => 12
      b => 33
      c => 46
    2 => (iflow)
      a => 12
      b => 33
      c => 46
Arb =>
  0 => (iflow)
    arb => 2
```

TABLE 43-continued

```
    1 => (iflow)
        arb => 2
    2 => (iflow)
        arb => 2
    3 => (iflow)
        arb => 2
my $Out = $In
        ->Select ( name     => "NV_select_parallel_arb_flow",
            Arb_Flow => $Arb );
$Out->print( "Out" );
Out =>
    0 => (iflow)
        a => 12
        b => 33
        c => 46
    1 => (iflow)
        a => 12
        b => 33
        c => 46
    2 => (iflow)
        a => 12
        b => 33
        c => 46
    3 => (iflow)
        a => 12
        b => 33
        c => 46
```

As shown in Table 43, there are 4 parents, each with 3 children input iflows. One child is chosen for each parent, thus producing 4 output iflows. The $Arb data flow in this case may have 4 separate decisions.

Also, in one embodiment, the one or more control constructs may include a Connect( ) construct. For example, a deferred input may not be a primary input. Instead, the deferred input may be part of a circular design. For example, it may go into the top of a contrived pipeline, then come out the bottom. The Connect( ) construct may be used to connect the bottom to the deferred data flow at the top. In this way, the data flows may become the same, thus completing the circle.

Table 44 illustrates the application of a Connect( ) construct, in accordance with one embodiment. Of course, it should be noted that the exemplary application shown in Table 44 is set forth for illustrative purposes only, and thus should not be construed as limiting in any manner.

TABLE 44

```
my $Out = $In
        ->Select( name => "NV_defer_circular" )
        ->print( "after select" )
        ->Multicast( name   => "NV_defer_circular", # silly example here
            count   => 3,
            broadcast => 1 )
        ->print( "after multicast" )
        ->Connect( $In );
after select => (iflow)
    a => 12
    b => 33
    c => 46
after multicast =>
    0 => (iflow)
        a => 12
        b => 33
        c => 46
    1 => (iflow)
        a => 12
        b => 33
        c => 46
    2 => (iflow)
        a => 12
        b => 33
        c => 46
```

In addition, in one embodiment, the one or more control constructs may include an As( ) construct. For example, the As( ) construct may be used to map iflow data to a completely different packet format. The As( ) construct may be used both inside and outside of a code block. In another embodiment, a user may pass a width to get a simple flattened Unit( ) leaf result, or the user may pass anything that can be passed to aFlow->Clone( ), including a name=>width list as shown above, or another active or inactive data flow to use as a template.

Furthermore, in one embodiment, $Flow->As_Bits( ) may include shorthand for $Flow->As($Flow->width( )). It may flatten out $Flow to the same number of raw bits. In another embodiment, if the input data flow has multiple iflows, then the template may be applied to each iflow. In yet another embodiment, the As( ) construct may not be used to modify data flows above the iflow level. Note that inside a code block, the input data flow may not denote multiple iflows. In still another embodiment, if the template is larger than the input iflow, then the result may be zero-extended, and if the template is smaller than the input iflow, then the result may be truncated. In another embodiment, after this operation is performed, the template may not be modified in any way.

Table 45 illustrates the application of an As) construct to a data flow within a scripting language, in accordance with one embodiment. Of course, it should be noted that the exemplary application shown in Table 45 is set forth for illustrative purposes only, and thus should not be construed as limiting in any manner.

TABLE 45

```
my $Out = $In->As( a => 5, b => 20 );
```

Table 46 illustrates the application of an As( ) construct as a control construct, in accordance with one embodiment. Of course, it should be noted that the exemplary application shown in Table 46 is set forth for illustrative purposes only, and thus should not be construed as limiting in any manner. As shown in Table 46, a hierarchical data flow is mapped to a Unit( ) leaf, and is then mapped back to the original packet format.

TABLE 46

```
my $In = aFlow
        ->Hier( a => 24 , b => 40 )
        ->Defer_Output( )
        ->print( "In" );
my $Out0 = $In->As( $In->width( ) );       # raw bits
my $Out1 = $Out0->As( $In );               # back to original format
In => (iflow)
    a => 24
    b => 40
Out0 => (iflow) 64
Out1 => (iflow)
    a => 24
    b => 40
```

Table 47 illustrates the application of an As( ) construct with different packet sizes, in accordance with one embodiment. Of course, it should be noted that the exemplary application shown in Table 47 is set forth for illustrative purposes only, and thus should not be construed as limiting in any manner. As shown in Table 47, a data flow is converted to a smaller packet (extra bits truncated), and then to a larger packet (zero-extended).

TABLE 47

```
my $In = aFlow
    ->Hier( a => 24 , b => 40 )
    ->Defer_Output( )
    ->print( "In" );
my $Out( ) = $In->As( a => 12 );        # to smaller packet containing only
half of "a"
my $Out1 = $Out0->As( $In );            # back to larger format (half of "a"
and all of "b" are zero'ed)
```

Table 48 illustrates the application of an As( ) construct inside a code block, in accordance with one embodiment. Of course, it should be noted that the exemplary application shown in Table 48 is set forth for illustrative purposes only, and thus should not be construed as limiting in any manner.

TABLE 48

```
my $In = aFlow
    ->Hier( a => 24 , b => 40 )
    ->Defer_Output( )
    ->print( "In" );
my $Out = $In
    ->Compute( name   => "NV_as_code",
               Out    => [ ],
               code   => sub
               {
                   my( $In, $Out ) = @_;
                   my $Out0 = $In->As( a0 => 12, a1 => 12 );   # grab each
half of "a"
                   my $Out1 = {< $In >};                       # equivalent to $In->As(
$In->width( ) )
                   my $Out2 = {< 3 of $In >};                  # use repetition operator
'of'
                   my $Out3 = $Out0->As( $In );                # no zero-extend it
back to $In format
                   my $Out4 = $Out0->As_Bits( );               # shorthand for
$Out0->As( $Out0->width( ) );
                   Null $Out;                                  # don't care about output
                   $In->print( "In" );
                   $Out0->print( "Out0" );
                   $Out1->print( "Out1" );
                   $Out2->print( "Out2" );
                   $Out3->print( "Out3" );
                   $Out4->print( "Out4" );
               }
       );
}
In => (iflow)
    a => 24
    b => 40
Out0 =>
    a0 => 12
    a1 => 12
Out1 => 64
Out2 => 192
Out3 =>
    a => 24
    b => 40
Out4 => 24
```

As shown in Table 48, the As( ) construct may be used inside a code block. For example, a concatenation operator {< >} may be used to flatten a hierarchical flow into a leaf. Further, the "of" extension may act as a macro that replicates $In 3 times inside the concatenation. In one embodiment, As_Bits( ) may be used as shorthand to flatten a data flow into the same number of raw bits. In another embodiment, "of" may be used anywhere a programming language (e.g., Perl, etc.) list is allowed and the RHS may not need to be an aFlow—it may return a Perl list.

Table 49 illustrates the parallel application of an As( ) construct inside a code block, in accordance with one embodiment. Of course, it should be noted that the exemplary application shown in Table 49 is set forth for illustrative purposes only, and thus should not be construed as limiting in any manner.

TABLE 49

```
my $In = aFlow
    ->Hier_N( 3, [a => 24 , b => 40] )
    ->Defer_Output( iflow_level => 1 )
    ->print( "In" );
my $Out0 = $In->As( a => 12 );          # make it smaller
my $Out1 = $Out0->As( $In->{0} );       # back to original format (per
iflow)
In =>
    0 => (iflow)
        a => 24
        b => 40
    1 => (iflow)
        a => 24
        b => 40
    2 => (iflow)
        a => 24
        b => 40
Out0 =>
    0 => (iflow)
        a => 12
    1 => (iflow)
        a => 12
    2 => (iflow)
        a => 12
Out1 =>
    0 => (iflow)
        a => 24
        b => 40
    1 => (iflow)
        a => 24
        b => 40
    2 => (iflow)
        a => 24
        b => 40
```

As shown in Table 49, the As( ) construct may be applied to each iflow of an input data flow. Note that each iflow may be rewired to look like the template. In one embodiment, changes may not be made above the iflow level.

Further, in one embodiment, the one or more control constructs may include a Shuffle( ) construct. For example, the Shuffle( ) construct may be used to rearrange data flows above the iflow level. This may result in pure wiring and no logic. In another embodiment, constructs such as Shuffle( ), Select( ), and Multicast( ) may be used to manipulate data flows above the iflow level. In still another embodiment, the Shuffle( ) construct may support a transpose operation.

Table 50 illustrates the options associated with a Shuffle( ) construct, in accordance with one embodiment. Of course, it should be noted that the options shown in Table 50 are set forth for illustrative purposes only, and thus should not be construed as limiting in any manner.

TABLE 50

| Option | Type | Default | Description |
| --- | --- | --- | --- |
| name | id | required | name of generated module |
| comment | string | undef | optional comment to display in the debugger (highly recommended) |
| op | string | transpose | the type of shuffle operation; only transpose is supported, so there is no point in ever supplying this option |
| level | string | iflow | child level at which to perform shuffle; there must be two levels available above this level |

TABLE 50-continued

| Option | Type | Default | Description |
|---|---|---|---|
| clk | id | global default | clock to use for this construct |

Table 51 illustrates the application of a Transpose( ) construct, in accordance with one embodiment. Of course, it should be noted that the exemplary application shown in Table 51 is set forth for illustrative purposes only, and thus should not be construed as limiting in any manner.

TABLE 51

```
my $In = aFlow
    ->Hier_N( 5, aFlow->Hier_N( 2, [a => 12, b => 33, c => 46] ) )
    ->Defer_Output( iflow_level => 2 );
$In->print( "In" );
In =>
  0 =>
    0 => (iflow)
      a => 12
      b => 33
      c => 46
    1 => (iflow)
      a => 12
      b => 33
      c => 46
  1 =>
    0 => (iflow)
      a => 12
      b => 33
      c => 46
    1 => (iflow)
      a => 12
      b => 33
      c => 46
  2 =>
    0 => (iflow)
      a => 12
      b => 33
      c => 46
    1 => (iflow)
      a => 12
      b => 33
      c => 46
  3 =>
    0 => (iflow)
      a => 12
      b => 33
      c => 46
    1 => (iflow)
      a => 12
      b => 33
      c => 46
  4 =>
    0 => (iflow)
      a => 12
      b => 33
      c => 46
    1 => (iflow)
      a => 12
      b => 33
      c => 46
my $Out = $In
    ->Shuffle( name => "NV_shuffle_transpose" );
$Out->print( "Out" );
Out =>
  0 =>
    0 => (iflow)
      a => 12
      b => 33
      c => 46
    1 => (iflow)
      a => 12
      b => 33
      c => 46
    2 => (iflow)
      a => 12
      b => 33
      c => 46
    3 => (iflow)
      a => 12
      b => 33
      c => 46
    4 => (iflow)
      a => 12
      b => 33
      c => 46
  1 =>
    0 => (iflow)
      a => 12
      b => 33
      c => 46
    1 => (iflow)
      a => 12
      b => 33
      c => 46
    2 => (iflow)
      a => 12
      b => 33
      c => 46
    3 => (iflow)
      a => 12
      b => 33
      c => 46
    4 => (iflow)
      a => 12
      b => 33
      c => 46
```

As shown in Table 51, inputs of a crossbar switch may be shuffled to the outputs of the switch. For example, the data flow may have at least two levels above the iflow level. In another example, a grandfather level may be at the top, with a parent level at level 1, and an iflow level at level 0. There may be 5 parents, each with 2 child iflows. After the transpose, the output data flow may have 2 parents, each with 5 child iflows, one taken from each of the input parents. In this way, output parent 0 may have child iflow 0 from each of the 5 input parents, and output parent 1 may have child iflow 1 from each of the 5 input parents.

Further still, in one embodiment, the one or more control constructs may include a Derive_Clock( ) construct. For example, the Derive_Clock( ) construct may be used to create a new clock from an existing clock from_clk "clk". In another embodiment, Disable_Flow may disable the new clock when Disable_Flow( )->Valid( ).

Table 52 illustrates the options associated with a Derive_Clock( ) construct, in accordance with one embodiment. Of course, it should be noted that the options shown in Table 52 are set forth for illustrative purposes only, and thus should not be construed as limiting in any manner.

TABLE 52

| Option | Type | Default | Description |
|---|---|---|---|
| name | id | required | name of new clock |
| comment | string | undef | optional comment to display in the debugger (highly recommended) |
| from_clk | id | global default | clock from which this new clock is derived; may be a primary or derived clock |
| Disable_Flow | flow | undef | optional empty flow that indicates when to disable the new clock |

Table 53 illustrates the application of a Derive_Clock ( ) construct, in accordance with one embodiment. Of course, it should be noted that the exemplary application shown in Table 53 is set forth for illustrative purposes only, and thus should not be construed as limiting in any manner.

TABLE 53 aFlow->default_options_set( clk => "derived_clk" );

In one embodiment, "derived_clk" may be made the default clk for subsequent constructs. In another embodiment, clock dividers, Enable_Flow, and other resets may be supported.

In this way, clocking, clock gating, and data flow control may be regulated automatically during the creation of the integrated circuit design, utilizing a hardware development language that is embedded in a scripting language. Additionally, the hardware development language may include high level built in control constructs that may be guaranteed to work and that may deal in terms of data flows. These control constructs may also be reused.

Further, the embedded hardware development language may incorporate validation and verification tests and may allow for automatic bottom up formal verification. Further still, the embedded hardware description language may be flexible and configurable, and may be compatible with a variety of programming languages (e.g., Verilog®, C++, CUDA™, etc.). Also, the embedded hardware development language may allow for debugging and visualization. For example, users may be taken to the earliest assertion failure within code, and signals may be automatically grouped.

Figure 3:
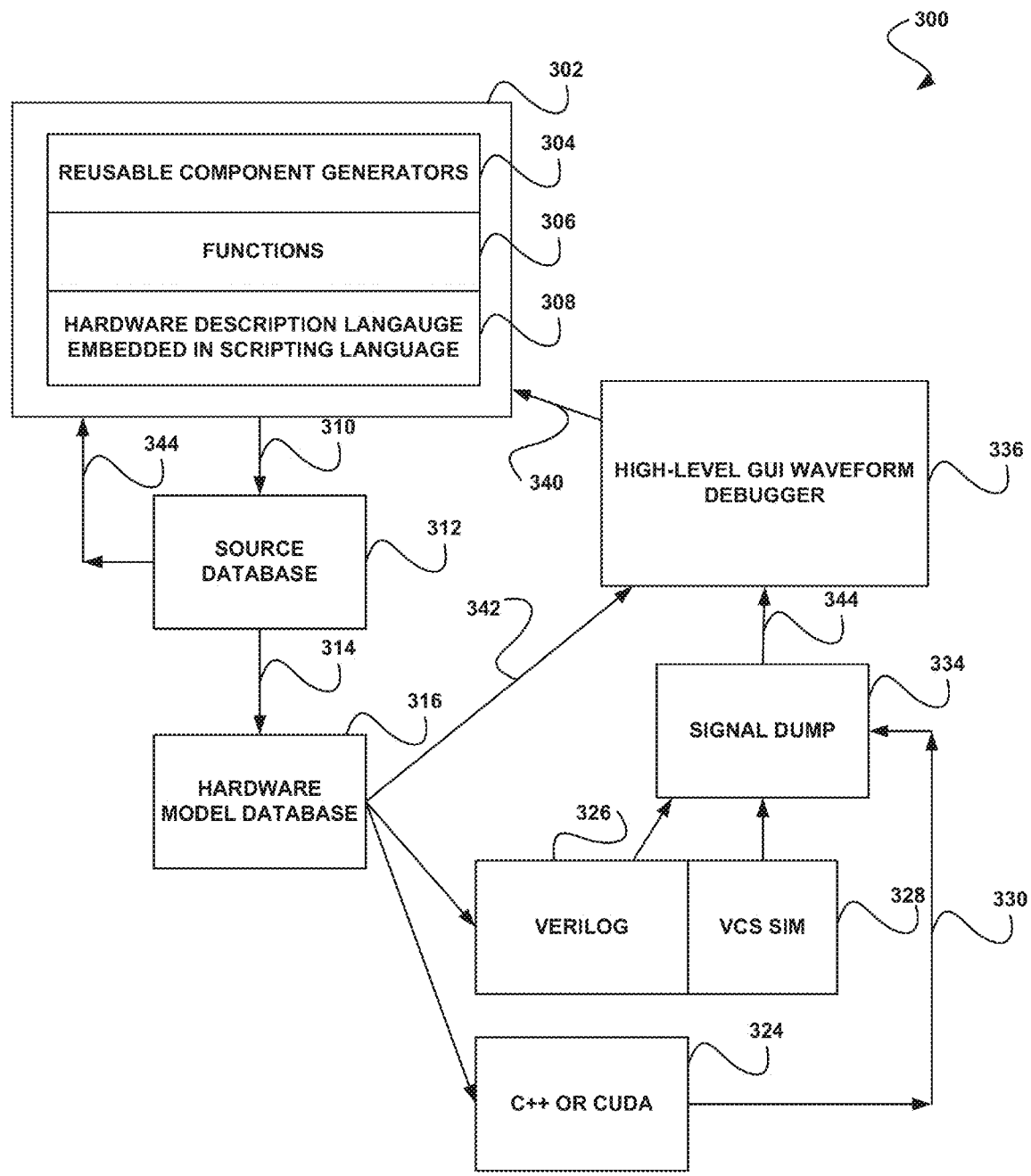
FIG. 3 shows an exemplary hardware design environment, in accordance with one embodiment.

FIG. 3 shows an exemplary hardware design environment 300, in accordance with one embodiment. As an option, the environment 300 may be carried out in the context of the functionality of FIGS. 1-2. Of course, however, the environment 300 may be implemented in any desired environment. It should also be noted that the aforementioned definitions may apply during the present description.

As shown, within a design module 302, reusable component generators 304, functions 306, and a hardware description language embedded in a scripting language 308 are all used to construct a design that is run and stored 310 at a source database 312. Also, any build errors within the design are corrected 344, and the design module 302 is updated. Additionally, the system backend is run on the constructed design 314 as the design is transferred from the source database 312 to a hardware model database 316.

Additionally, the design in the hardware model database 316 is translated into C++ or CUDA™ 324, translated into Verilog® 326, or sent directly to the high level GUI (graphical user interface) waveform debugger 336. If the design is translated into C++ or CUDA™ 324, the translated design 330 is provided to a signal dump 334 and then to a high level debugger 336. If the design is translated into Verilog® 326, the translated design is provided to the signal dump 334 or a VCS simulation 328 is run on the translated design, which is then provided to the signal dump 334 and then to the high level GUI waveform debugger 336. Any logic bugs found using the high level GUI waveform debugger 336 can then be corrected 340 utilizing the design module 302.

Figure 4:
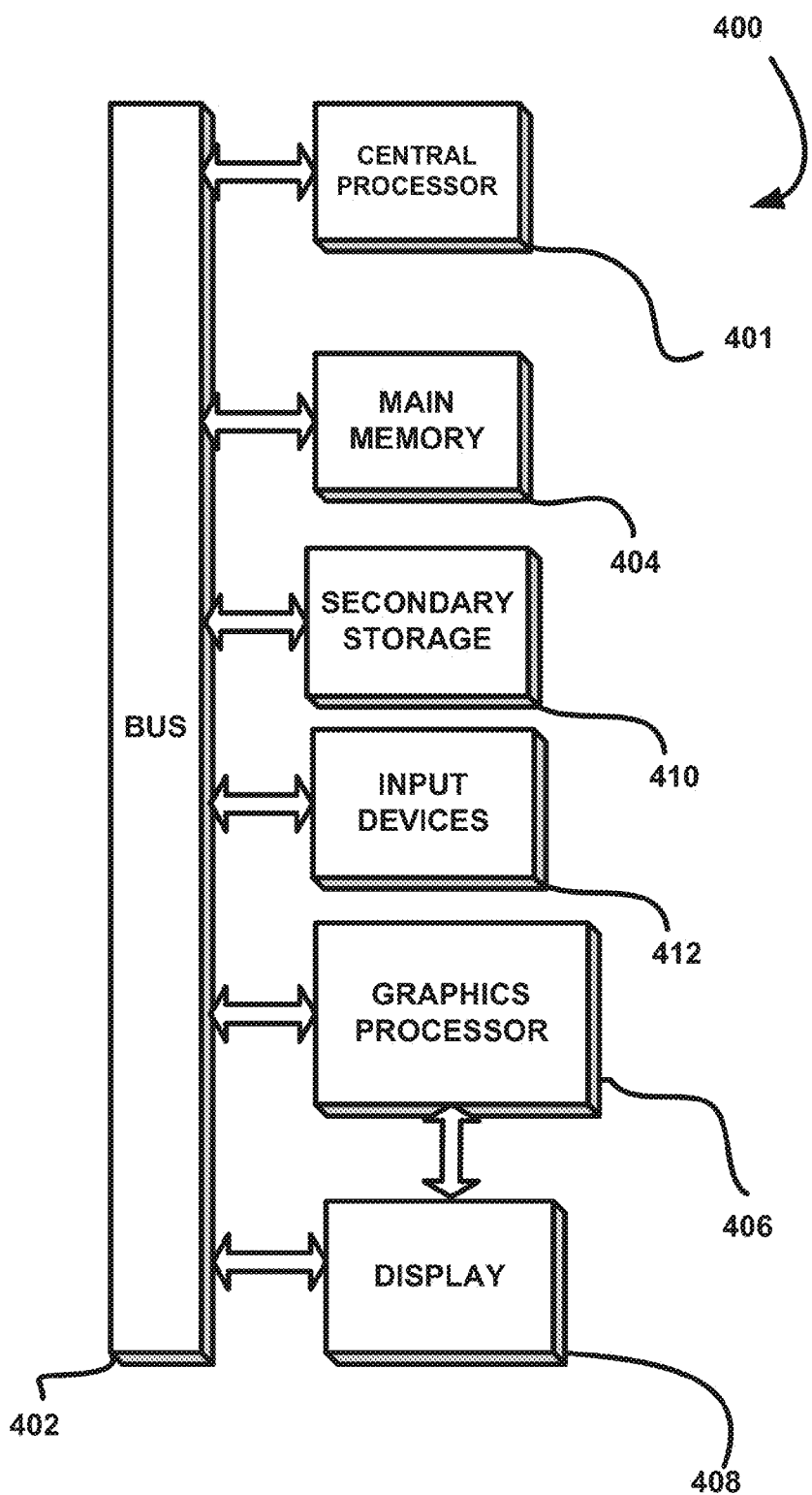
FIG. 4 illustrates an exemplary system in which the various architecture and/or functionality of the various previous embodiments may be implemented.

FIG. 4 illustrates an exemplary system 400 in which the various architecture and/or functionality of the various previous embodiments may be implemented. As shown, a system 400 is provided including at least one host processor 401 which is connected to a communication bus 402. The communication bus 402 may be implemented using any suitable protocol, such as PCI (Peripheral Component Interconnect), PCI-Express, AGP (Accelerated Graphics Port), HyperTransport, or any other bus or point-to-point communication protocol(s). The system 400 also includes a main memory 404. Control logic (software) and data are stored in the main memory 404 which may take the form of random access memory (RAM).

The system 400 also includes input devices 412, a graphics processor 406 and a display 408, i.e. a conventional CRT (cathode ray tube), LCD (liquid crystal display), LED (light emitting diode), plasma display or the like. User input may be received from the input devices 412, e.g., keyboard, mouse, touchpad, microphone, and the like. In one embodiment, the graphics processor 406 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user. The system may also be realized by reconfigurable logic which may include (but is not restricted to) field programmable gate arrays (FPGAs).

The system 400 may also include a secondary storage 410. The secondary storage 410 includes, for example, a hard disk drive and/or a removable storage drive, representing a floppy disk drive, a magnetic tape drive, a compact disk drive, digital versatile disk (DVD) drive, recording device, universal serial bus (USB) flash memory, etc. The removable storage drive reads from and/or writes to a removable storage unit in a well-known manner.

Computer programs, or computer control logic algorithms, may be stored in the main memory 404 and/or the secondary storage 410. Such computer programs, when executed, enable the system 400 to perform various functions. Memory 404, storage 410 and/or any other storage are possible examples of computer-readable media.

In one embodiment, the architecture and/or functionality of the various previous figures may be implemented in the context of the host processor 401, graphics processor 406, an integrated circuit (not shown) that is capable of at least a portion of the capabilities of both the host processor 401 and the graphics processor 406, a chipset (i.e. a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 400 may take the form of a desktop computer, laptop computer, server, workstation, game consoles, embedded system, and/or any other type of logic. Still yet, the system 400 may take the form of various other devices m including, but not limited to a personal digital assistant (PDA) device, a mobile phone device, a television, etc.

Further, while not shown, the system 400 may be coupled to a network [e.g. a telecommunications network, local area network (LAN), wireless network, wide area network (WAN)

such as the Internet, peer-to-peer network, cable network, etc.) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A computer program product embodied on a non-transitory computer readable medium, comprising:
    code for receiving one or more parameters, wherein at least one parameter of the one or more parameters corresponds to an interface protocol;
    code for constructing a data flow based on the one or more parameters, wherein the data flow represents a flow of data through a hardware design;
    code for receiving an indication of one or more constructs represented in a hardware description language, the one or more constructs selected from a group of constructs consisting of control constructs and compute constructs; and
    code for creating a hardware design, based on the data flow and the one or more constructs,
    wherein control constructs include an entity implemented as part of the hardware description language that receives one or more data flows as input.

2. The computer program product of claim 1, wherein the one or more constructs may include a module implemented as part of the hardware description language and that receives one or more data flows as input.

3. The computer program product of claim 2, wherein at least one construct in the one or more constructs is a control construct that performs one or more operations based on the one or more data flows received as input.

4. The computer program product of claim 1, wherein at least one construct in the one or more constructs is a control construct that creates one or more output data flows, based on the one or more input data flows.

5. The computer program product of claim 1, wherein at least one construct in the one or more constructs is a configured to generate one or more output data flows that are provided as inputs into one or more additional constructs.

6. The computer program product of claim 1, wherein a data flow is input to one or more of the constructs, which creates one or more output data flows based on the data flow received as input.

7. The computer program product of claim 1, wherein the one or more constructs include a separate construct that creates multiple output data flows from a single input data flow.

8. The computer program product of claim 1, wherein the one or more constructs include a merge construct that creates a single output data flow from multiple input data flows.

9. The computer program product of claim 1, wherein the one or more constructs include a multicast construct that takes a single input data flow and sends it to one or more output data flows.

10. The computer program product of claim 1, wherein the one or more constructs include a select construct that accepts multiple input data flows and selects one of them to be an output data flow.

11. The computer program product of claim 1, wherein the one or more constructs include a connect construct that connects an input data flow of the construct to a deferred output.

12. The computer program product of claim 11, wherein the deferred output includes a primary input to the hardware design or an input data flow that does not yet connect to an output data flow of another construct.

13. The computer program product of claim 1, wherein the one or more constructs include an as construct that maps flow data to a different format.

14. The computer program product of claim 1, wherein the one or more constructs include a shuffle construct that rearranges a structuring of input data flows.

15. The computer program product of claim 1, wherein the one or more constructs include a derive clock construct that creates a new clock from an existing clock.

16. The computer program product of claim 1, wherein one or more of the constructs include one or more parameters.

17. The computer program product of claim 16, wherein the one or more parameters include one or more of a name parameter, a comment parameter, a stallable parameter, a parameter used to specify a depth of an output queue, a parameter that causes an output data flow of the construct to be registered out, and a parameter that causes a ready signal of an output data flow of the construct to be registered in.

18. A method, comprising:
    receiving one or more parameters, wherein at least one parameter of the one or more parameters corresponds to an interface protocol;
    constructing a data flow based on the one or more parameters, wherein the data flow represents a flow of data through a hardware design;
    receiving an indication of one or more constructs represented in a hardware description language, the one or more constructs selected from a group of constructs consisting of control constructs and compute constructs; and
    creating, via a processor, a hardware design based on the data flow and the one or more constructs,
    wherein control constructs include an entity implemented as part of the hardware description language that receives one or more data flows as input.

19. A system, comprising:
    a processor for:
        receiving one or more parameters, wherein at least one parameter of the one or more parameters corresponds to an interface protocol,
        constructing a data flow based on the one or more parameters, wherein the data flow represents a flow of data through a hardware design,
        receiving an indication of one or more constructs represented in a hardware description language, the one or more constructs selected from a group of constructs consisting of control constructs and compute constructs,
        creating a hardware design based on the data flow and the one or more constructs,
        wherein control constructs include an entity implemented as part of the hardware description language that receives one or more data flows as input.

* * * * *